United States Patent
Tateishi

(10) Patent No.: US 7,770,535 B2
(45) Date of Patent: Aug. 10, 2010

(54) CHEMICAL SOLUTION APPLICATION APPARATUS AND CHEMICAL SOLUTION APPLICATION METHOD

(75) Inventor: Fuminori Tateishi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1112 days.

(21) Appl. No.: 11/440,129

(22) Filed: May 25, 2006

(65) Prior Publication Data

US 2006/0280865 A1 Dec. 14, 2006

(30) Foreign Application Priority Data

Jun. 10, 2005 (JP) ............................. 2005-170921

(51) Int. Cl.
*B05B 3/00* (2006.01)
*B05B 7/06* (2006.01)
*B05C 11/00* (2006.01)
*B05C 11/02* (2006.01)

(52) U.S. Cl. ................. 118/321; 118/323; 118/313; 118/315; 118/683; 118/52

(58) Field of Classification Search ........... 118/52, 118/612, 319, 320, 313–315, 56, 679–684, 118/321, 323; 427/240; 396/611, 627, 604; 134/153, 198, 902
See application file for complete search history.

(56) References Cited

U.S. PATENT DOCUMENTS 5,643,826 A 7/1997 Ohtani et al.
5,658,615 A * 8/1997 Hasebe et al. ............... 427/240
6,715,943 B2 * 4/2004 Nagamine .................... 396/611
6,776,845 B2 * 8/2004 Minami et al. ............... 118/665

FOREIGN PATENT DOCUMENTS

| EP | 0 651 431 | 5/1995 |
|---|---|---|
| EP | 1 158 580 | 11/2001 |
| JP | 06-015224 | 1/1994 |
| JP | 07-130652 | 5/1995 |
| JP | 08-078329 | 3/1996 |
| JP | 08-141477 | 6/1996 |

* cited by examiner

*Primary Examiner*—Yewebdar T Tadesse
(74) *Attorney, Agent, or Firm*—Eric J. Robinson; Robinson Intellectual Property Law Office, P.C.

(57) ABSTRACT

An object is to provide a chemical solution application apparatus capable of applying a chemical solution evenly and without irregularity by a spin coating method. A plurality of nozzles are provided for applying a chemical solution to an application object that is fixed over a stage. Each of the nozzles is individually mobile in vertical and horizontal directions. For this reason, controlling a discharging point or pattern is possible, and application responding to a wider viscosity range of chemical solutions is possible. By implementing the present invention, a chemical solution application apparatus equipped with a discharging method of a chemical solution by which a coating film having a small film thickness distribution over an entire substrate and an even thickness can be obtained, as well as for which use efficiency is improved by cutting down on waste of a chemical solution to be discharged.

12 Claims, 17 Drawing Sheets

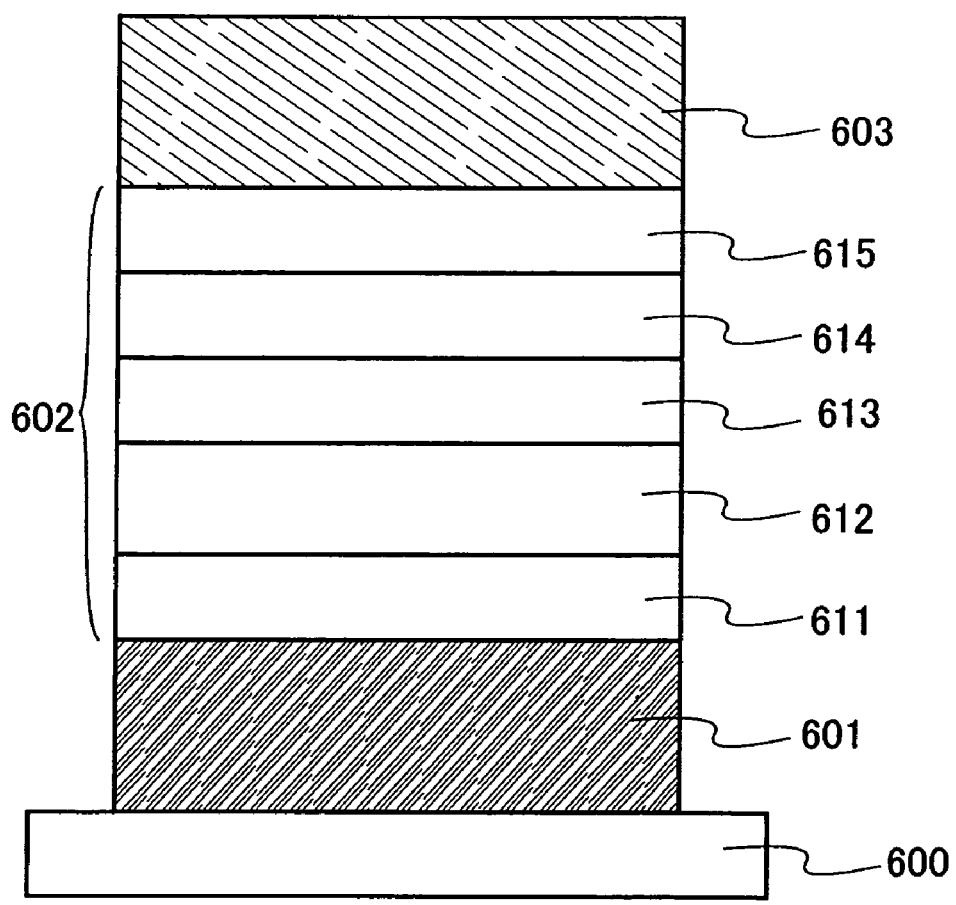

702a

G — H

702b

771a

G    702a    H

703
G
H
704

780a

G   703   H

CHEMICAL SOLUTION APPLICATION APPARATUS AND CHEMICAL SOLUTION APPLICATION METHOD

BACKGROUND OF THE INVENTION

1. Field of the Invention

The present invention relates to a chemical solution application apparatus and a chemical solution coating method for applying a chemical solution to an application object.

2. Description of the Related Art

A chemical solution application apparatus typified by a conventional spin coater apparatus forms a thin film over a substrate surface by fixing the substrate on a rotating disk, continually dripping droplets from a single nozzle to a single central spot of the substrate surface or to a plurality of spots, and rotating the rotating disk (for example, refer to Patent Document 1: Japanese Patent Laid-Open No. H6-15224).

Also, an apparatus that applies a liquid from a plurality of nozzles is being devised, in response to size increase in substrates or for the purpose of using several kinds of chemical solutions. A photoresist can be spread evenly over a whole top surface of a substrate by moving nozzles in which a plurality of dripping holes are linearly arranged as each dripping hole drips the photoresist so as to drip the photoresist over the entire top surface of the substrate, and rotating a turntable by driving a motor so that the substrate turns in the surface direction (for example, refer to Patent Document 2: Japanese Patent Laid-Open No. H8-141477).

SUMMARY OF THE INVENTION

However, in an application method that continuously drips droplets from a single nozzle to a plurality of spots, an application cannot be even over a substrate since a fluid coloring resin that is discharged earlier dries and a film thickness of a region to which the fluid coloring resin is discharged earlier becomes thick, while the nozzle is being moved.

Also, a dripping method, where a nozzle in which a plurality of dripping holes arranged linearly is unidirectionally moved linearly and relatively, is appropriate when a substrate has a square-form and the size is specified; however, when application is done on a round-form substrate or on substrates with different sizes, wasting of a discharge material occurs. Resists are expensive, and should not be wasted. Further, in a similar manner to the case of a single nozzle, while the plurality of nozzles arranged linearly is moved, a discharge material discharged earlier gradually dries; therefore, by the time of subsequently rotating a turntable by driving a motor, viscosity changes between the first and last regions the discharge material is dripped, and irregular application occurs.

When the type (viscosity) of a chemical solution to be discharged is changed, the way the chemical solution coats an application object also changes significantly. In the case of low viscosity, the chemical solution is spinned off before the entire surface of a substrate is coated evenly. In the case of high viscosity, there is a case where the chemical solution does not spread and coat the entire surface. Therefore, in order to obtain an even coating film, selecting discharge points with respect to the substrate is important. However, for a nozzle in which a plurality of dripping holes are arranged linearly, there is a problem that a discharge point pattern cannot be selected.

In view of the foregoing problem, an object of the present invention is to provide a chemical solution discharging method and a chemical solution application apparatus by which a coating film having an even thickness and a small film thickness distribution over an entire surface can be obtained. Also, an object is to provide a chemical solution discharging method and a chemical solution application apparatus which avoid wasting a chemical solution to be discharged and for which use efficiency is improved.

One feature of a structure of the present invention includes a stage holding a substrate; a plurality of nozzles provided facing the substrate held by the stage and which discharge a chemical solution on the substrate; a driving mechanism that freely moves each of the plurality of nozzles; and a control portion that controls an amount of chemical solution that is discharged from the plurality of nozzles.

One feature of a structure of the present invention includes a stage holding a substrate; a plurality of nozzles provided facing the substrate held by the stage and which discharge a chemical solution on the substrate; a first driving mechanism that freely moves each of the plurality of nozzles; a second driving mechanism that moves the stage; and a control portion that controls an amount of chemical solution that is discharged from the plurality of nozzles.

One feature of a structure of the present invention includes a stage holding a substrate; a plurality of nozzles provided facing the substrate held by the stage and which discharge a chemical solution on the substrate; a first driving mechanism that freely moves each of the plurality of nozzles; a second driving mechanism that moves the stage; a tank storing the chemical solution; and a control portion attached to the tank via a piping and controls an amount of chemical solution that is discharged from the plurality of nozzles.

One feature of a structure of the present invention includes a stage holding a substrate; a guide rail provided facing the substrate held by the stage; a plurality of nozzles held by the guide rail, that discharge a chemical solution on the substrate; a tank storing the chemical solution; and a control portion attached to the tank via a piping and controls an amount of chemical solution that is discharged from the plurality of nozzles; wherein the plurality of nozzles are each capable of freely moving along the guide rail.

In the foregoing one feature of a structure of the present invention, the guide rail is arranged in a matrix form.

One feature of a structure of the present invention is equipped with a stage holding a substrate; a guide rail provided facing the substrate held by the stage; a plurality of nozzles held by the guide rail, that discharge a chemical solution on the substrate; a tank storing the chemical solution; and a control portion attached to the tank via a piping and controls an amount of chemical solution that is discharged from the plurality of nozzles; wherein each of the plurality of nozzles is freely moved and arranged in a prescribed position along the guide rail, and a chemical solution is discharged from the plurality of nozzles to the substrate held over the stage.

In the foregoing one feature of a structure of the present invention, the plurality of nozzles can move in a vertical direction with respect to an application object.

In the foregoing one feature of a structure of the present invention, all of the plurality of nozzles need not be used, and the number of nozzles used can be changed depending on the size of a substrate, the viscosity of a chemical solution, and the like.

In one feature of the present invention, a chemical solution discharged from a/the plurality of nozzles is not limited to one type. Several kinds of chemical solutions are filled in each tank, and by changing the nozzles selected at a time of discharge, a coating film can be formed continuously.

As a chemical solution discharged in the present invention, an organic resin such as an acrylic resin, a polyimide resin, a melamine resin, a polyester resin, a polycarbonate resin, a phenol resin, an epoxy resin, polyacetal, polyether, polyurethane, polyamide (nylon), polyimide-amide, a fran resin, or a diallyl phthalate resin; or, siloxane, polysilazane, or hexamethyldisilazane, can be used. Alternatively, a solution using a polar solvent such as water, alcohol, ether, dimethylformamide, dimethylacetamide, dimethylsulfoxide, N-methylpyrrolidon, hexamethylphosphamide, chloroform, or methylene chloride, can be used. Further, a resist such as a diazonaphthoquinone-novolac resin series (developing solution is TMAH (Tetramethylammonium hydroxide)), polymethylmethacrylate (developing solution is a solution of methylisobutylketone:isopropyl alcohol=1:3), or a copolymer of alphamethylstyrene-alphachloroacrylic acid (developing solution is a mixed xylene) can be used. Also, a silane coupling agent such as FAS (fluoroalkylsilane) can be used. Needless to say, the chemical solution is not limited to the chemical solutions listed above, and a variety of chemical solutions can be used depending on the purpose.

By implementing the present invention, a chemical solution application apparatus equipped with a discharging method can be obtained, by which a coating film having an even thickness and a small film thickness distribution over an entire surface can be obtained, and for which use efficiency can be improved by cutting down on waste of a chemical solution to be discharged.

A resist which is one discharge material is expensive. However, it is said that during ordinary spin coating, 97% of a resist dripped on a wafer spatters. Therefore, by using a chemical solution application apparatus of the present invention having a driving mechanism capable of freely moving each of a plurality of nozzles, a most appropriate amount can be discharged in a most appropriate place, and use efficiency of a resist can be drastically improved.

When a substrate is large and rectangular, by also positioning nozzles in edge portions of the substrate, spinning off of a chemical solution does not occur in the four corners of the substrate, and forming an even coating film even on a large-sized substrate becomes possible.

BRIEF DESCRIPTION OF DRAWINGS

In the accompanying drawings:

FIG. 6 shows a typical structure of a light emitting element;

DETAILED DESCRIPTION OF THE INVENTION

Embodiment Modes

Although the present invention will be described by way of embodiment modes with reference to the accompanying drawings, it is to be understood that various changes and modifications will be apparent to those skilled in the art. Therefore, unless such changes and modifications depart from the scope of the invention, they should be construed as being included therein.

Embodiment Mode 1

Figure 1:
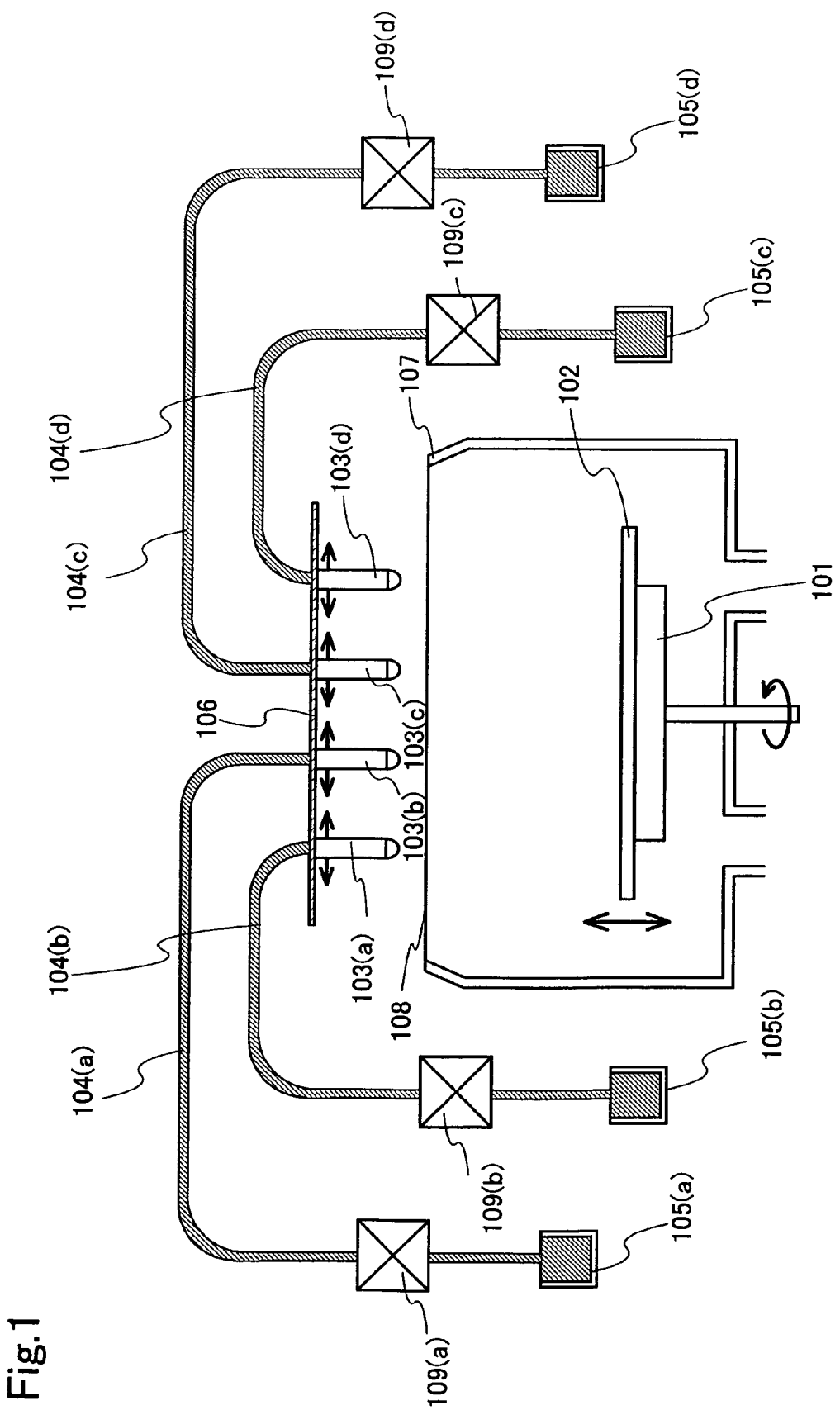
FIG. 1 shows a cross-sectional view describing a structure of a chemical solution application apparatus of the present invention.
Figure 2A:
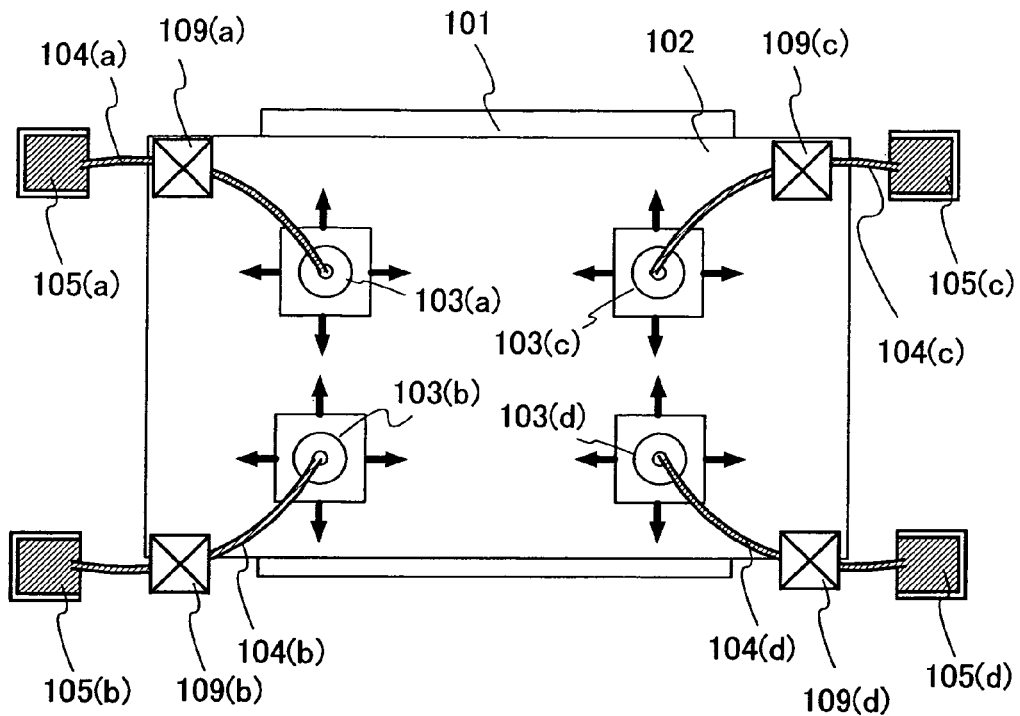
FIGS. 2A and 2B each show a top view of a chemical solution application apparatus of the present invention.
Figure 2B:
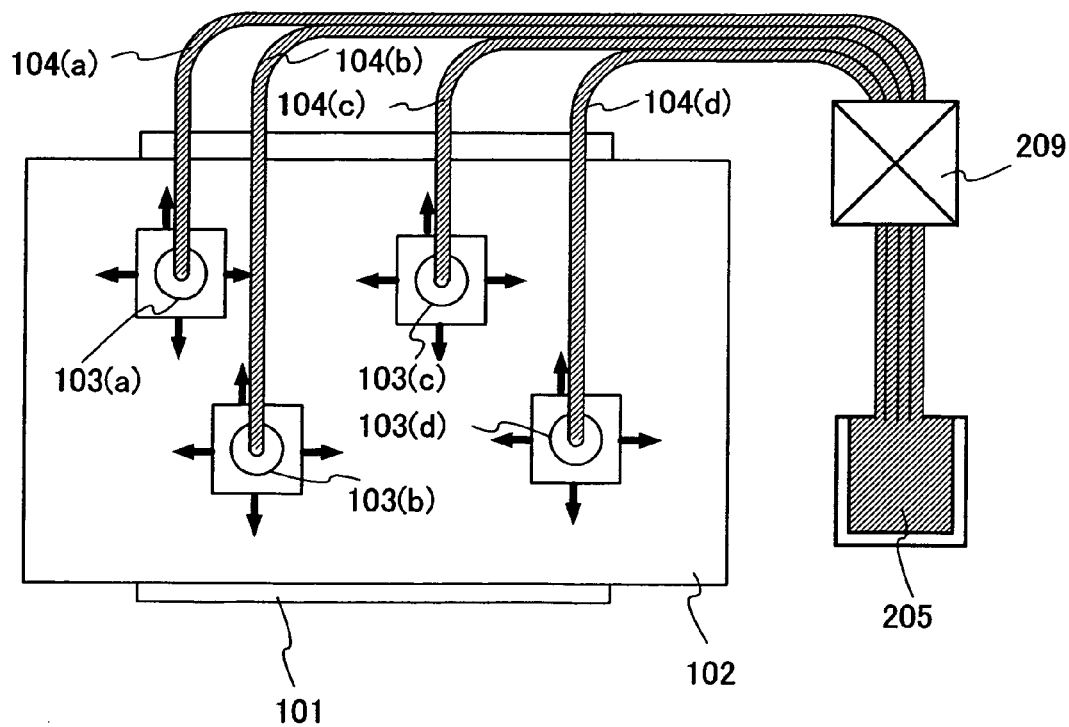

First, a chemical solution application apparatus equipped with a plurality of mobile nozzles is described using FIG. 1 and FIGS. 2A and 2B. FIG. 1 is a side view of a chemical solution application apparatus of the present invention, and FIGS. 2A and 2B are top views. A substrate 102 is set over a suction stage 101 (also called a rotation supporting board or turntable). Also, a plurality of mobile nozzles 103($a$) to ($d$) are fixed on a guide rail 106 (abbreviated in FIGS. 2A and 2B). Each of the nozzles 103($a$) to ($d$) can change directions along an x axis, a y axis, and a z axis, and are connected to chemical solution pumping portions (tanks) 105($a$) to ($d$) through pipings 104($a$) to ($d$). Between the plurality of nozzles 103 and the tanks 105, chemical solution discharge control mechanisms (also called discharge controlling means or control portions) 109($a$) to ($d$) are connected to control them. Further, each of the tanks 105($a$) to ($d$) which has received a signal from the chemical solution discharge control mechanisms 109($a$) to ($d$) adjusts its chemical solution pumping by the signal, and discharges a chemical solution of a prescribed amount from each of the nozzles 103($a$) to ($d$). By the chemical solution discharge control mechanisms 109($a$) to ($d$), a discharging amount and a discharging speed can be changed depending on the position and shape of a substrate. Further, a cup 107 and a cup lid 108 are set so that a chemical solution does not spatter out while the substrate 102 is rotating and so that the chemical solution that has become a mist is prevented from reattaching to the substrate 102 by controlling airflow in the cup 107 (see FIG. 1).

The tanks 105(a) to (d) may be provided between each of the nozzles 103(a) to (d) and the chemical solution discharge control mechanisms 109(a) to (d). Also, if a mechanism for adjusting chemical solution pumping is provided on each of the tanks 105(a) to (d) itself, the chemical solution discharge control mechanisms 109(a) to (d) are not necessarily provided.

The tanks 105(a) to (d) and the chemical solution discharge control mechanisms 109(a) to (d) need not be provided for each of the nozzles 103(a) to (d), and as shown in FIG. 2B, a single chemical solution discharge control mechanism 209 and a single tank 205 may be provided.

For the stage, a driving mechanism which moves the stage in vertical and horizontal directions may be provided. Also, as a substrate holding method instead of the stage, a spin chuck employing a mechanical chuck system may be used. Note that in FIGS. 1, 2A and 2B, the substrate 102 is shown to be larger than the stage 101; however, the stage 101 may be larger.

The distance between the substrate 102 and the mobile nozzles 103(a) to (d) can be adjusted by moving the substrate in a vertical direction.

Figure 3:
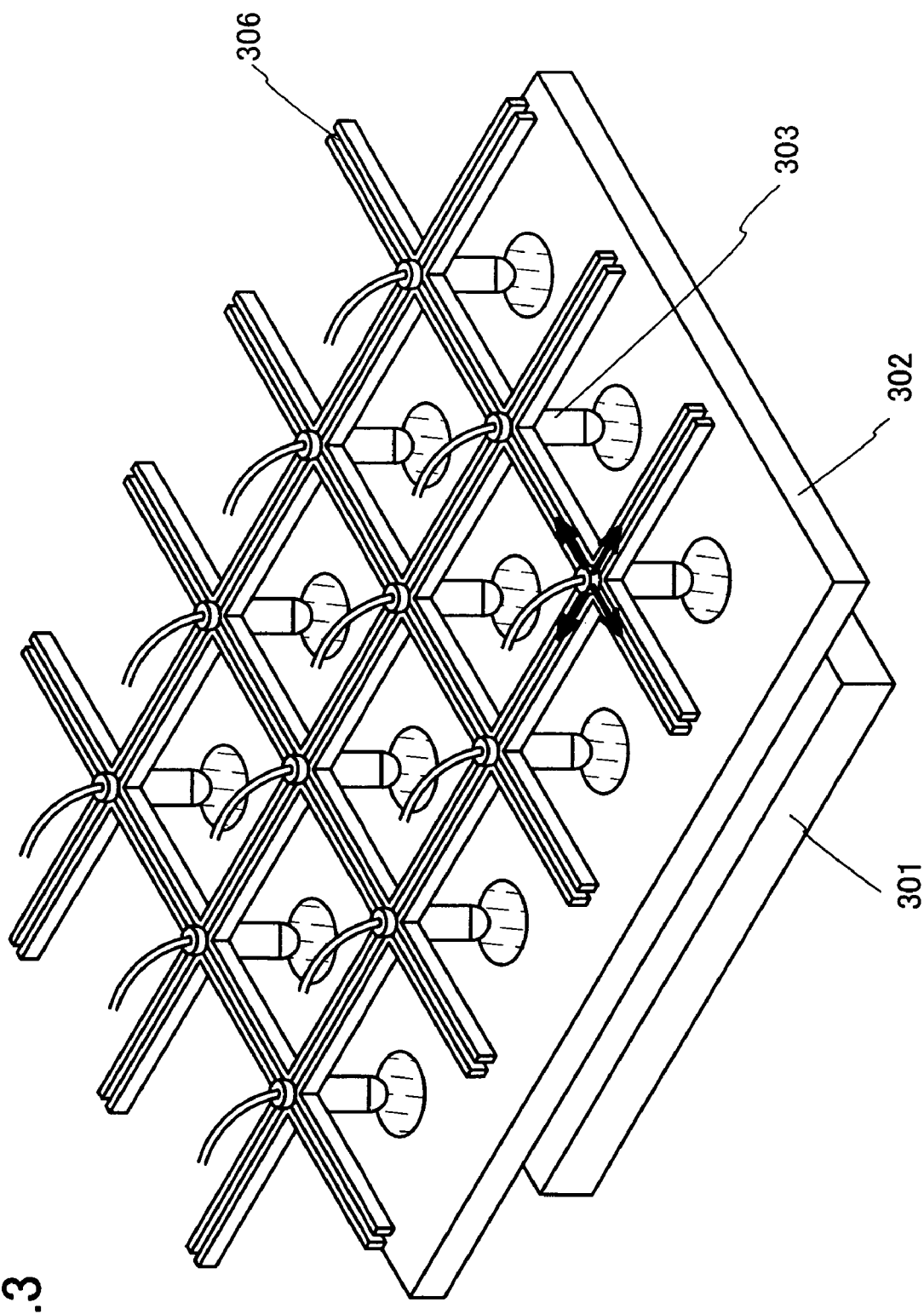
FIG. 3 shows a perspective view of a chemical solution application apparatus of the present invention.

Note that the plurality of mobile nozzles 103(a) to (d) may be moved automatically or manually. When it is automatic, the plurality of nozzles can be freely moved by providing a driving mechanism capable of individually moving them. FIG. 3 shows a perspective view of a chemical solution application apparatus of a case where the nozzles are moved manually. Over a substrate (application object) 302 fixed on a turntable 301, a guide rail 306 are arranged in a grid. Under the guide rail 306, a plurality of nozzles 303 are fixed by a jig. Each of the nozzles 303 can be made to discharge by manually moving it in a direction shown by arrows and changing a position where it is fixed. At this time, by making the grid fine, a degree of freedom in arranging the nozzles increases.

Note that the plurality of the mobile nozzles are not necessarily all used at the same time. A nozzle in a necessary spot can be run to discharge on a case-by-case basis depending on a size of a substrate or an amount or viscosity of a chemical solution. Further, a chemical solution to be used in a subsequent coating film can be put in a tank connected to a remaining nozzle, and a coating film may be formed continually. As a result, throughput can be improved.

Figure 17:
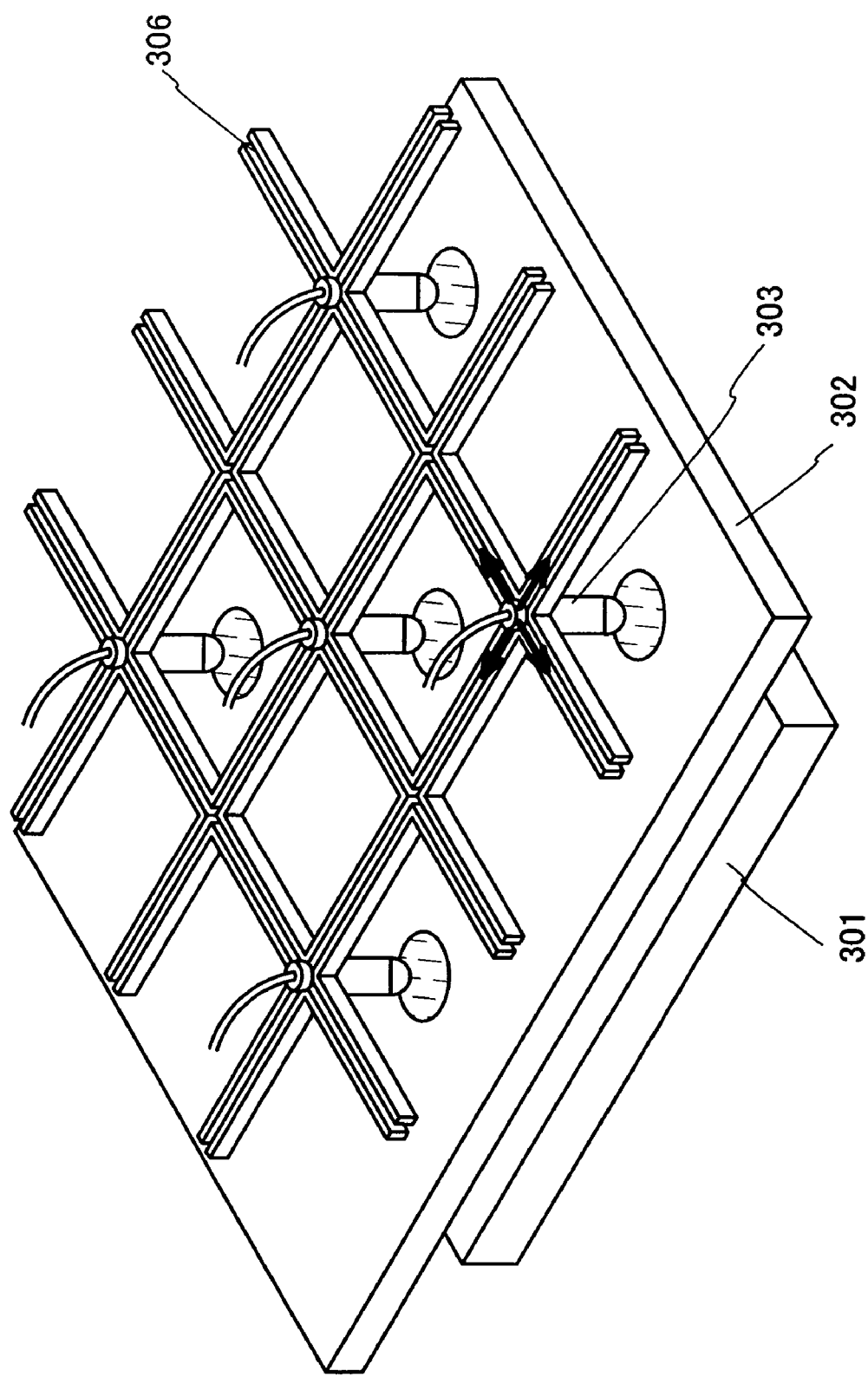
FIG. 17 shows a perspective view of a chemical solution application apparatus of the present invention.

Note that in FIGS. 1 to 2B, only four nozzles are shown; however, it goes without saying that it is not limited to this number. The number of nozzles may be any as long as it is 2 or more. The number may be decided depending on a size of a substrate or viscosity of a chemical solution to be applied. For example, the number of nozzles may be a number found by a multiplication of the number of rows and the number of columns (n×m (n, m>0)), as shown in FIG. 3. Also, the number does not need to be a number that can be found by the multiplication, and the number of nozzles may be five like in a chemical solution application apparatus shown in FIG. 17.

In the present invention, every time a substrate or a chemical solution is changed, an arrangement of the nozzles can be changed depending on a size of the substrate, viscosity of the chemical solution, and how easily the chemical solution dries. For example, for a rectangular, large substrate, the nozzles are moved and arranged also in the four corners. For example, for a chemical solution that easily dries, the nozzles are moved and arranged evenly over the entire substrate. In this manner, since each of the plurality of nozzles can move freely, a coating film that is even over an entire substrate can be formed by finely adjusting an arrangement of the nozzles depending on a size of the substrate, viscosity of a chemical solution, or the like.

Embodiment Mode 2

This embodiment mode is described using FIGS. 7A to 15. More specifically, a manufacturing method of a display device (which means a liquid crystal display device herein) to which the present invention is applied is described. First, a manufacturing method of a display device including a channel-etch type thin film transistor, to which the present invention is applied is described. Figures A of FIGS. 7 to 9 and FIGS. 11 to 13 each show a top view of a display device pixel portion, and the figures B of FIGS. 7 to 9 and FIGS. 11 to 13 each show a cross-sectional view of the figures A of FIGS. 7 to 9 and FIG. 11 along lines G-H.

Over a substrate 700, a base film 701 is formed as a base pretreatment. For the substrate 700, a glass substrate made from barium borosilicate glass, alumino borosilicate glass, or the like; a quartz substrate; a silicon substrate; a metal substrate; a stainless steel substrate; or a plastic substrate having heat resistance that can resist a treatment temperature of the present manufacturing process is used. Also, a surface of the substrate 700 may be polished by a CMP (chemical mechanical polishing) method or the like so that the surface is planarized. Note that an insulating layer may be formed over the substrate 700. The insulating layer is formed using at least one of an oxide material containing silicon and a nitride material, as a single layer or as a lamination. This insulating layer is not necessary to be formed; however, it has an effect of shutting off a contaminant from the substrate 700. This insulating layer can be formed using a chemical solution application apparatus of the present invention. The insulating layer can be formed to have an even film thickness by setting an optimal discharging pattern that accommodates to a viscosity of a material of the insulating film. In a case of forming a base layer for preventing contamination from a glass substrate, the base film 701 is formed as the base pretreatment for a gate electrode layer 703 to be formed thereover by a droplet discharging method. Note that the droplet discharging method refers to a method of forming the base film 701 and the gate electrode layer 703 or the like in an arbitrary location by selectively discharging (jetting) droplets (also called "dots") of a composition including a material for a conductive film, an insulating film, or the like. Depending on its system, the droplet discharging method may refer to discharging by an inkjet device.

Figure 7A:
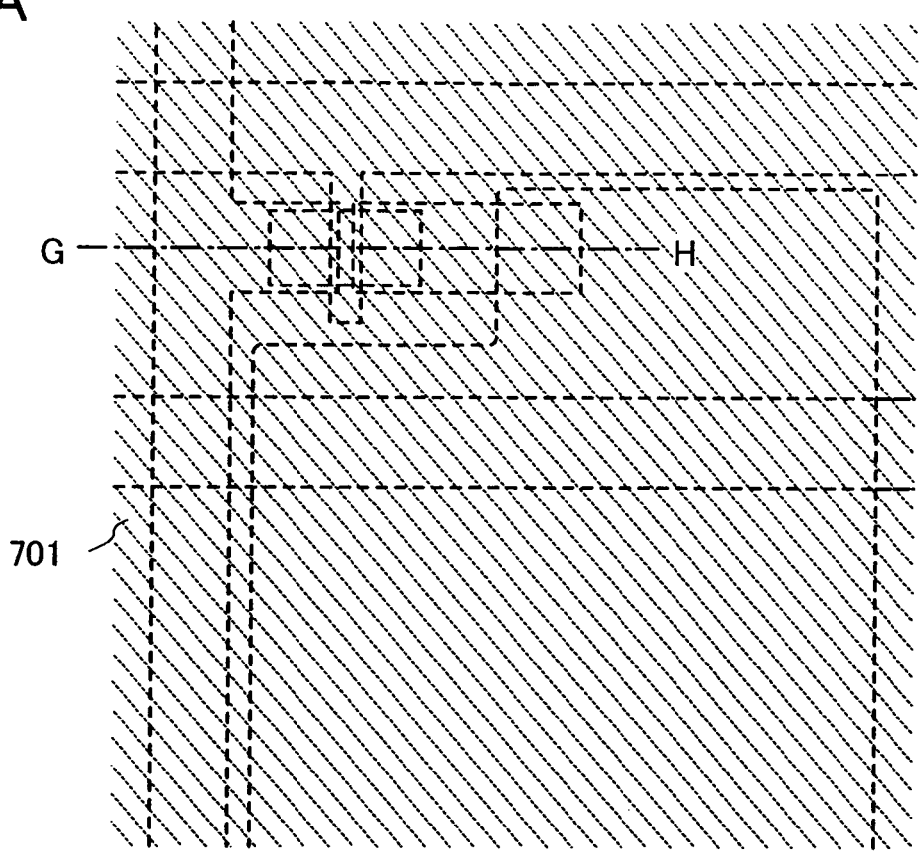
FIGS. 7A and 7B show a top view and a cross-sectional view, respectively, of a manufacturing process of a pixel portion in a display device to which the present invention is applied.
Figure 7B:
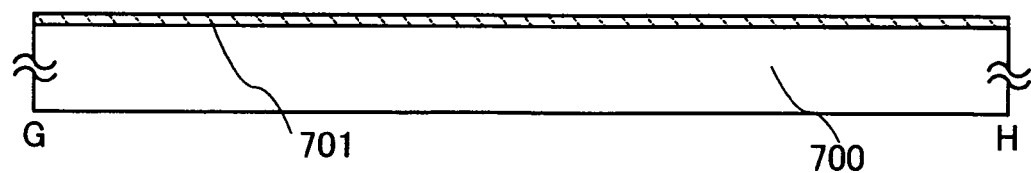

In this embodiment mode, a substance having low wettability is formed as the base film 701 (see FIGS. 7A and 7B). This base film 701 can also be formed using the chemical solution application apparatus of the present invention. The base film can be formed to have an even film thickness by setting an optimal discharging pattern that accommodates to a viscosity of a material of the base film.

Figure 8A:
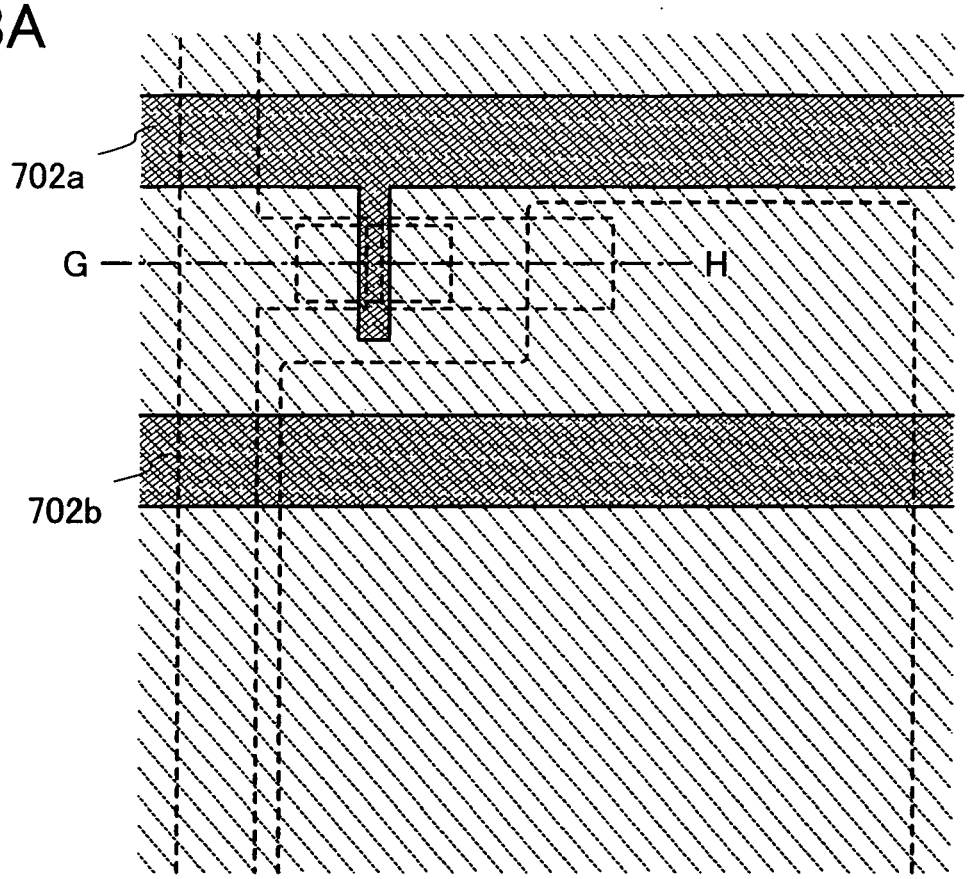
FIGS. 8A and 8B show a top view and a cross-sectional view, respectively, of a manufacturing process of a pixel portion in a display device to which the present invention is applied.
Figure 8B:
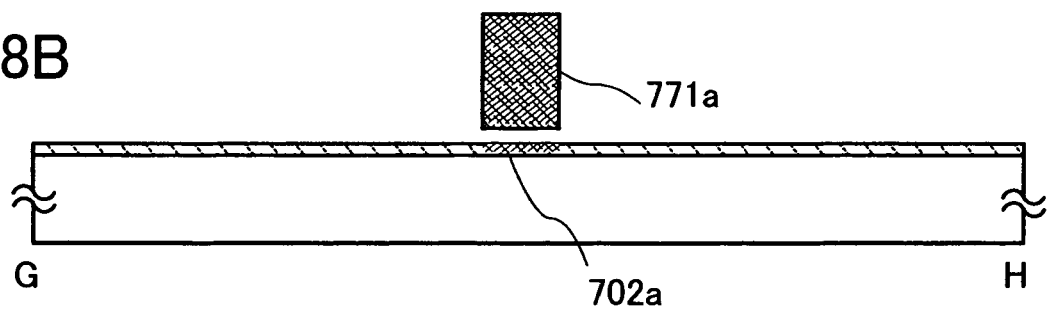

Subsequently, a modification treatment is carried out on the base film by irradiating a region in which the gate electrode layer is to be formed with a laser light 771a by a laser device (see FIGS. 8A and 8B). By this modification treatment, base films 702a and 702b become regions having higher wettability with respect to a composition including a conductive material for forming the gate electrode layer to be laminated thereover. Consequently, a difference in the degree of wettability occurs between the base films 702a and 702b and a peripheral base film, with respect to the composition including a conductive material.

Wettability is explained herein. High wettability means having high lyophilic property (low repellent property), and when a liquid composition having fluidity is formed on a surface of a region having high wettability, a contact angle of the liquid composition having fluidity becomes small. When the contact angle is small, the liquid composition having fluidity expands over a surface and wets the surface well. On the contrary, low wettability means having a high repellent property (low lyophilic property), and when the liquid composition having fluidity is formed on a surface of a region having low wettability, a contact angle of the liquid composition having fluidity becomes large. When the contact angle is large, the liquid composition having fluidity does not expand over a surface of a region and is repelled, and does not wet the surface. A region having a different wettability has a different surface energy. A surface energy of a surface of a region having high wettability is large, and a surface energy of a surface of a region having low wettability is small. A contact angle of a liquid composition having fluidity formed on a region having high wettability is preferably 30 degrees or less, and a contact angle of a liquid composition having fluidity formed on a region having low wettability is preferably 90 degrees or more.

Figure 9A:
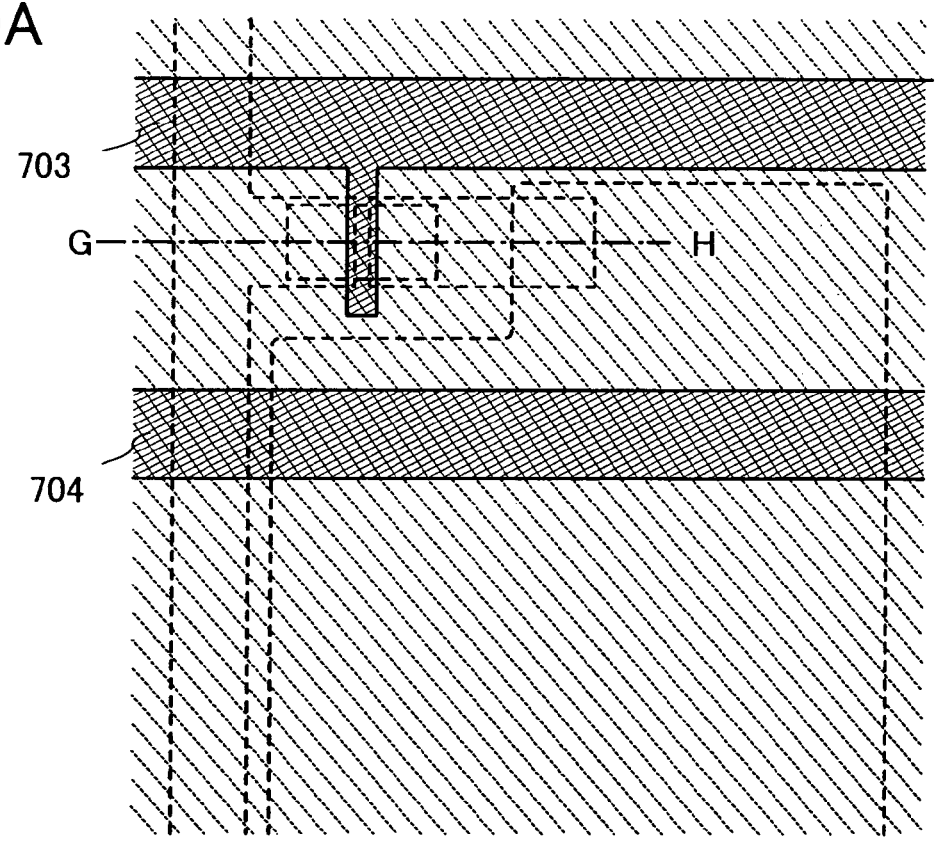
FIGS. 9A and 9B show a top view and a cross-sectional view, respectively, of a manufacturing process of a pixel portion in a display device to which the present invention is applied.
Figure 9B:
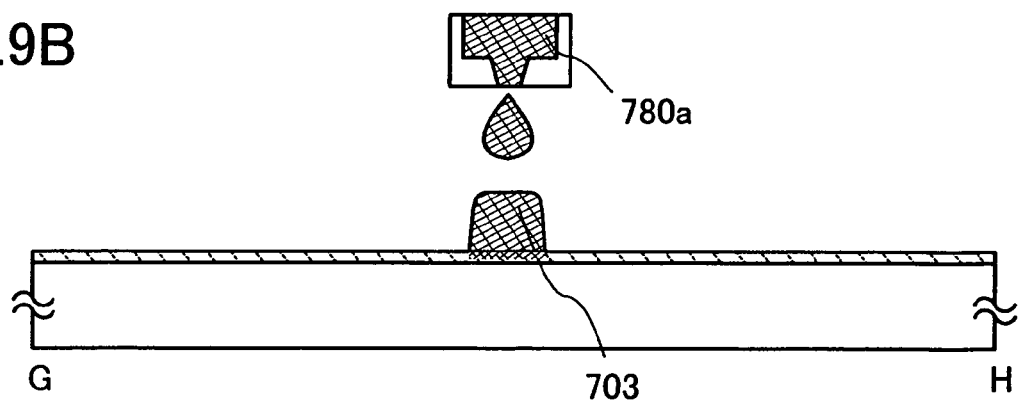

In regions of the base films 702a and 702b for which a modification treatment has been carried out by laser light, the gate electrode layer 703 and a capacitor wiring layer 704 are formed by discharging droplets of a composition including a conductive material by a droplet discharging apparatus 780a (see FIGS. 9A and 9B). Over the base film 701, the discharged droplets are formed in the regions of the base films 702a and 702b. which have higher wettability than a surrounding region. Even in a case where sizes of discharging openings of nozzles by which droplets are discharged are larger than a desired size of a conductive layer to be formed, by applying a treatment for increasing wettability to a formation region of the conductive layer, the droplets only adhere to the formation region, and the conductive layer is formed to be a thin line. This is because, since a difference in a degree of wettability is made to occur between the formation region and a peripheral region, the droplets are repelled in the peripheral region and stay in the formation region having a higher wettability.

By carrying out a modification by irradiating a treatment object with laser light, when a fine pattern is to be formed like the gate electrode layer 703, the droplets do not expand over the formation region and can be in a thin line even if a discharge opening of droplets is somewhat large. Also, by controlling a liquid amount of the droplets, controlling a film thickness of the conductive layer is also possible. Since laser light is capable of fine processing, by carrying out a modification of a film by laser light irradiation, a fine wiring, an electrode, and the like can be formed with good controllability.

Note that when the base film 701 formed as a base pretreatment is to be formed using a chemical solution application apparatus of the present invention, and when it is necessary to remove a solvent, baking or drying may be carried out.

The base film 701 may be formed with a thickness of 0.01 to 10 nm; however, since it is acceptable as long as it is formed to be extremely thin, having a layer structure is not always necessary. In a case where a metal material or a 3d transition metal element is used as the base film and when the base film has a conductive property, for a base film other than a conductive layer formation region, it is desirable to carry out the following two methods.

As a first method, an insulating layer is formed by making the base film 701 that does not overlap with the gate electrode layer 703 (in other words, a peripheral region having a lower wettability) to be insulating. In other words, the base film 701 that does not overlap with the gate electrode layer 703 is oxidized to make it insulating. In this manner, in a case of making the base film 701 that does not overlap with the gate electrode layer 703 to be insulating by oxidization, it is preferably formed to have a thickness of 0.01 to 10 nm since oxidation can easily be done. As a method of oxidation, a method of exposing the base film 701 that does not overlap with the gate electrode layer 703 under an oxygen atmosphere may be used, or a method of carrying out a heat treatment may be used.

As a second method, an insulating layer is selectively formed in a formation region of the gate electrode layer 703 (a region to which a composition including a conductive material is discharged). The base film 701 that does not overlap with the gate electrode layer 703 may be selectively formed over a substrate using a droplet discharging method or the like, or by forming over an entire surface of the substrate by an application method of the present invention, and then selectively etching away and removing the base film 701 with the gate electrode layer 703 as a mask. When using this process, a thickness of the base film 701 is not restricted.

Further, as another method, an organic material based substance that functions like an adhesive material may be formed in order to increase adhesion of a pattern to be formed by a droplet discharging method and a formation region thereof. An organic material (organic resin material) (polyimide, acrylic), or an organic group (for example, an alkyl group or an aromatic hydrocarbon) including at least hydrogen for a substituent group and for which a skeleton structure is formed by a bond between silicon (Si) and oxygen (O), is used. A fluoro group may be used as the substituent group. Alternatively, as the substituent groups, an organic group including at least hydrogen and a fluoro group may be used.

Formation of the gate electrode layer 703 and the capacitor wiring layer 704 is carried out using a droplet discharging means. The droplet discharging means is a collective term for means of discharging droplets, such as a head having a nozzle with a discharge opening for a composition, and a head with one or a plurality of nozzles.

As a base pretreatment for a conductive layer formed using a droplet discharging method, the aforementioned process of forming the base film 701 is carried out; however, this treatment process may be carried out after forming the gate electrode layer 703 and the capacitor wiring layer 704.

Also, after the gate electrode layer 703 and the capacitor wiring layer 704 are formed by discharging a composition by a droplet discharging method, a surface of the gate electrode layer 703 and the capacitor wiring layer 704 may be planarized by pressing with pressure in order to increase planarity. As a method of pressing, asperity may be evened out and reduced by scanning a roller-like object over the surface, or the surface may be pressed vertically with a flat, board-like object. A heating process may be carried out during pressing. Further, an asperity portion of the surface may be removed by an air knife after softening or melting the surface with a fluxing material or the like. Also, the surface may be polished using a CMP method. This process can be applied to in a case where asperity occurs due to a droplet discharging method and when the surface is to be planarized. As a result, a wiring with a line width of 5 μm or less is formed as the gate electrode layer.

Figure 10A:
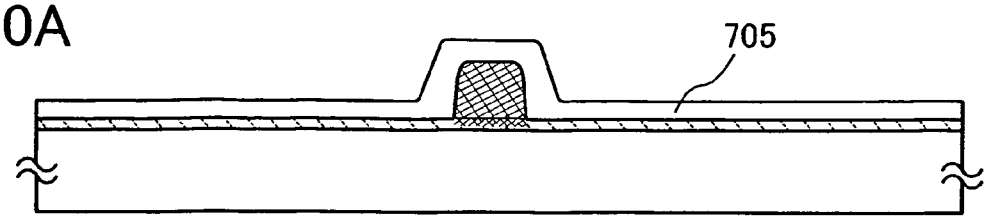
FIGS. 10A to 10E each show a cross-sectional view of a manufacturing process of a pixel portion in a display device to which the present invention is applied.
Figure 10B:
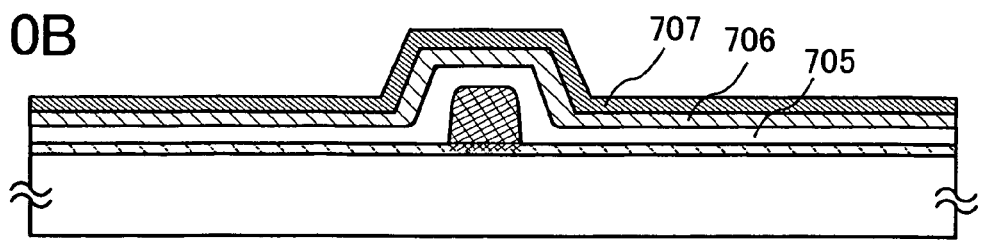

Subsequently, a gate insulating layer 705 is formed over the gate electrode layer 703 and the capacitor wiring layer 704 (see FIG. 10A). The gate insulating layer 705 may be formed with a known material such as a silicon oxide material or a silicon nitride material and may be a single layer or a lamination layer. In this embodiment mode, a three layer lamination of a silicon nitride film, a silicon oxide film, and a silicon nitride film. Alternatively, the gate insulating layer 705 may have a single layer of silicon oxynitride film or two layers thereof. Preferably, a dense silicon nitride film is used. When using silver, copper or the like for the conductive layers formed by a droplet discharging method, diffusion of an impurity is prevented and a surface of the conductive layer is planarized by forming a silicon nitride film or a NiB film thereover as a barrier film. In order to form a dense insulating film with little gate leakage current at a low film forming temperature, a reactive gas containing a rare gas element such as argon may be mixed into the insulating film to be formed.

Next, a semiconductor film is formed. A semiconductor layer having one conductivity type may be formed as necessary. In this embodiment mode, a semiconductor layer 706, and an N-type semiconductor layer 707 as a semiconductor layer having one conductivity type, are laminated (see FIG. 10B). Note that a P channel type TFT for which a P type semiconductor layer is formed instead of an N type semiconductor layer can be formed. Further, a CMOS structure formed with an N channel type TFT and a P channel type TFT can also be manufactured. Also, in order to give conductivity, by forming an impurity region in the semiconductor layer by adding an element giving conductivity through doping, an N-channel type TFT and a P-channel type TFT can be formed.

In this embodiment mode, an amorphous semiconductor is used as a semiconductor. After a semiconductor layer is formed, an N-type semiconductor layer is formed as a semiconductor layer having one conductivity type by a plasma CVD method or the like.

Figure 10C:
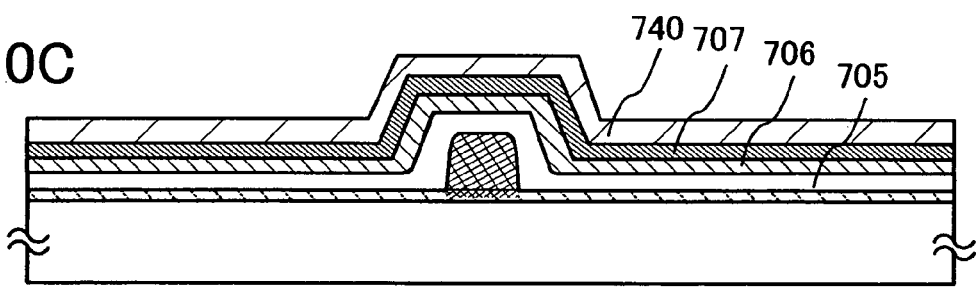

Subsequently, a Nega-type resist 740 is applied over the N-type semiconductor layer 706 using a chemical solution application apparatus of the present invention (see FIG. 10C). As a commercial resist material including a photosensitize, a base resin, diphenylsilanediol, an acid generator, and the like which are Nega-type resists, can be used. A Posi-type resist may be used instead of a Nega-type resist, and for example, a typical positive type resist such as a novolac resin or a naphthoquinone diazide compound that is a photosensitizer can be used. Further, as a mask replacing a resist, a resin material such as an epoxy resin, an acrylic resin, a phenol resin, a novolac resin, a melamine resin, or an urethane resin is used. Furthermore, an organic material such as benzocyclobutene, parylene, allylene ether fluoride, or a permeable polyimide; a compound material made by polymerization of a siloxane based polymer or the like; a composition material including a water-soluble homopolymer and a water-soluble copolymer; or the like may be used. In using any of the materials, surface tension and viscosity thereof are appropriately adjusted by adjusting a concentration of a solvent and/or by adding a surfactant or the like.

Figure 10D:
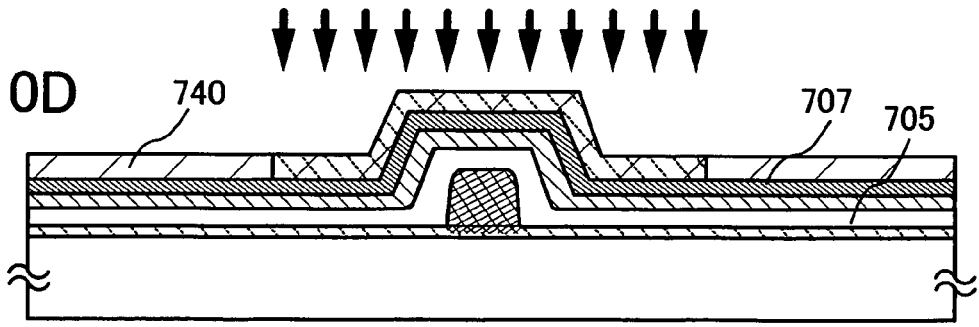
Figure 10E:
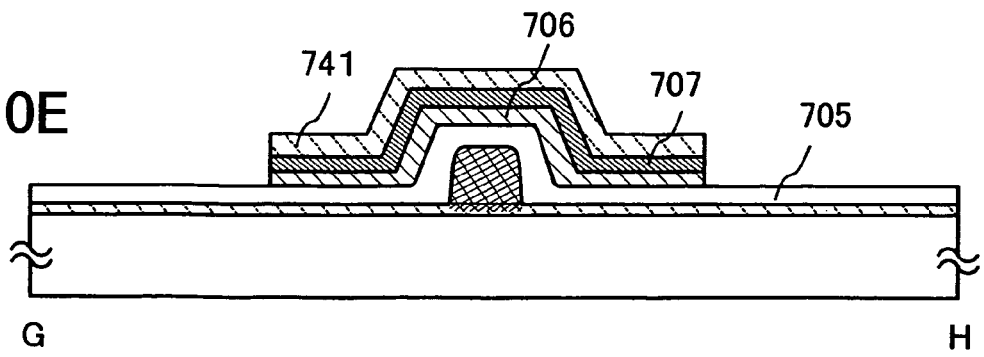
Figure 11A:
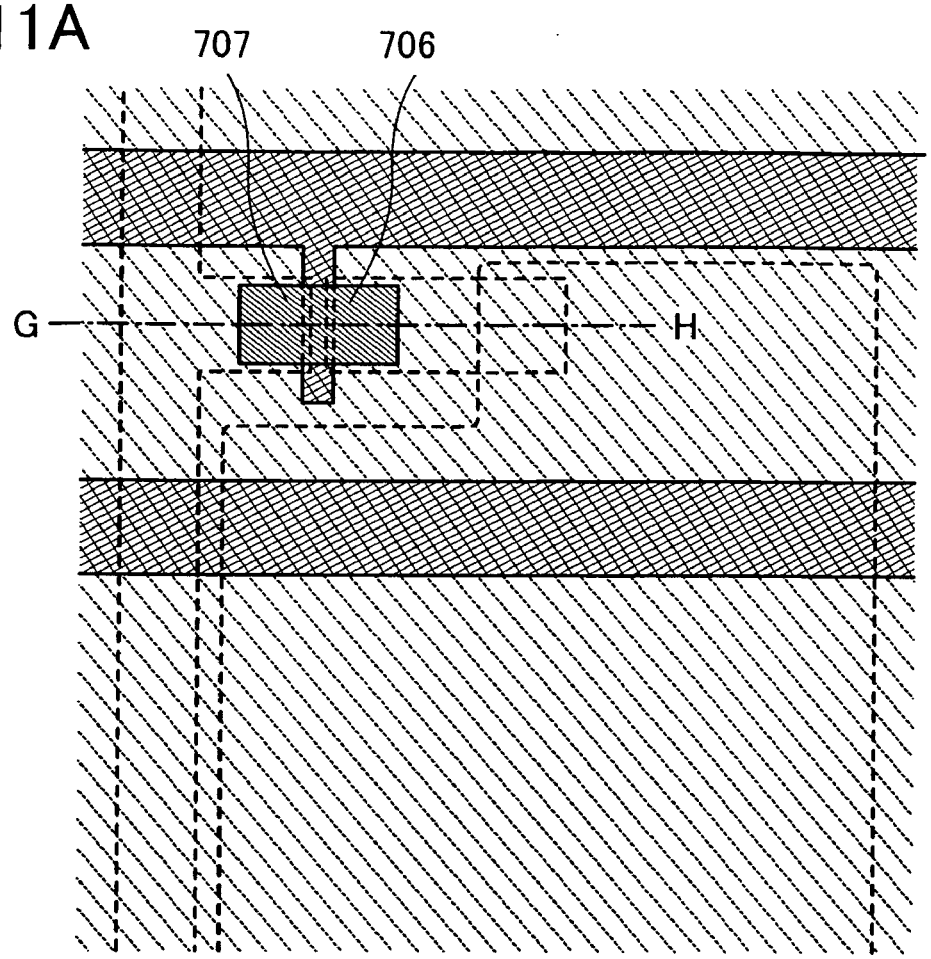
FIGS. 11A and 11B show a top view and a cross-sectional view, respectively, of a manufacturing process of a pixel portion in a display device to which the present invention is applied.
Figure 11B:
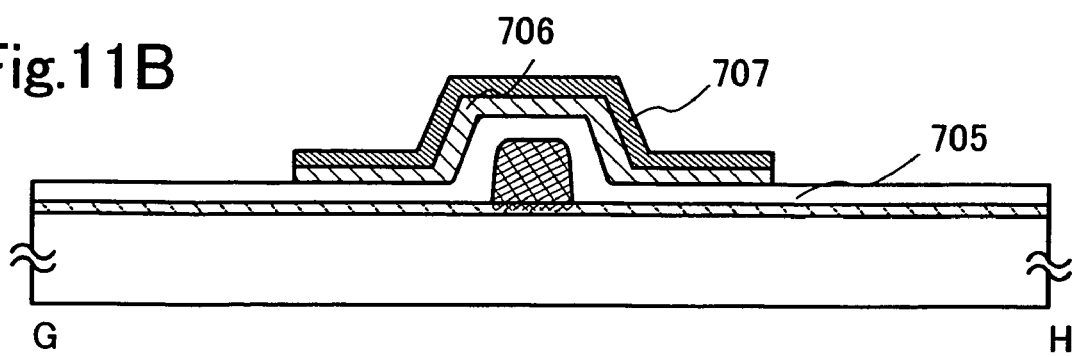

Next, a portion in which the resist is to be left is irradiated with light (see FIG. 10D). Subsequently, a mask 741 is formed by removing the resist that is not exposed to light, by a developing treatment. Then, the semiconductor layer 706 and the N-type semiconductor layer 707 are formed by simultaneously patterning a semiconductor layer and an N-type semiconductor layer using the mask 741 (see FIG. 10E). Note that the mask can be formed by selectively discharging a composition. In the above manner, the semiconductor layer 706 and the N-type semiconductor layer 707 are formed (see FIGS. 11A and 11B).

Also, in this embodiment mode, as a pretreatment when the gate electrode layer 703 and the capacitor wiring layer 704 are formed by a droplet discharging method, a pattern can be selectively formed, like how a base film is formed and then a modification treatment by laser light irradiation is carried out. When the pattern is formed by discharging droplets by a droplet discharging method, a modification treatment can be carried out on a pattern formation region by a laser light irradiation treatment. By carrying out this modification treatment only in the formation region, a difference in wettability occurs between the formation region and a peripheral region thereof, and the pattern can be formed with good controllability since the droplets stay only in the formation region having high wettability.

Figure 12A:
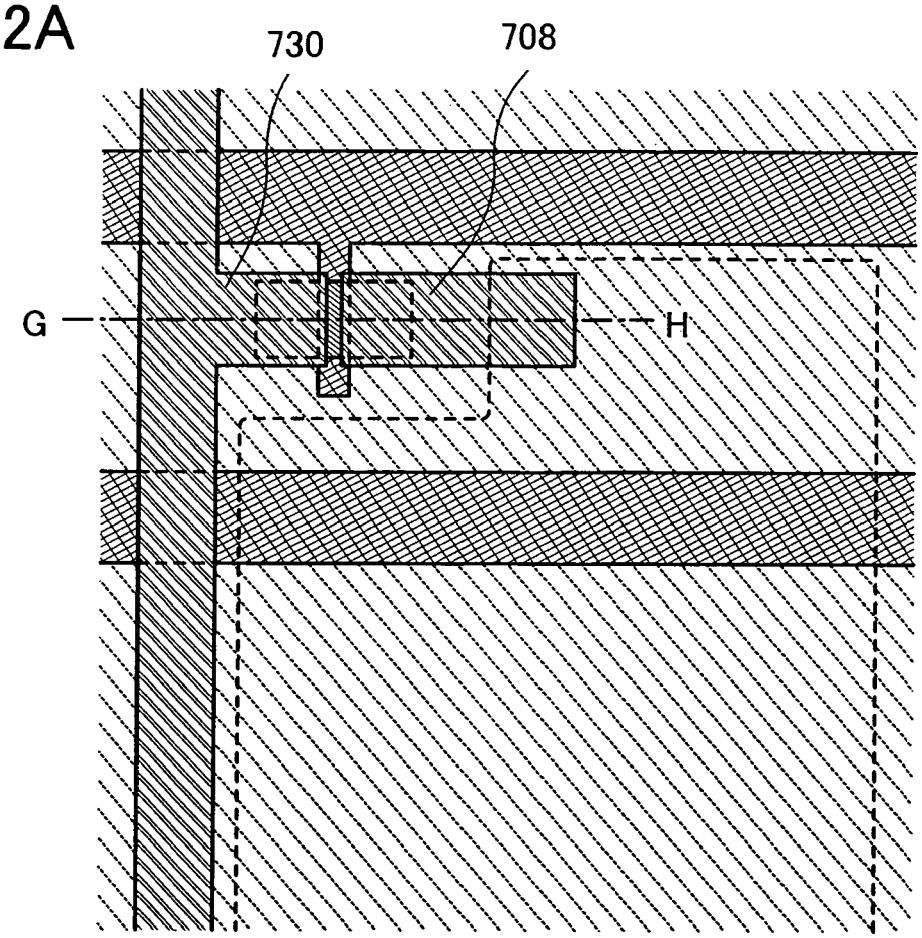
FIGS. 12A and 12B show a top view and a cross-sectional view, respectively, of a manufacturing process of a pixel portion in a display device to which the present invention is applied.
Figure 12B:
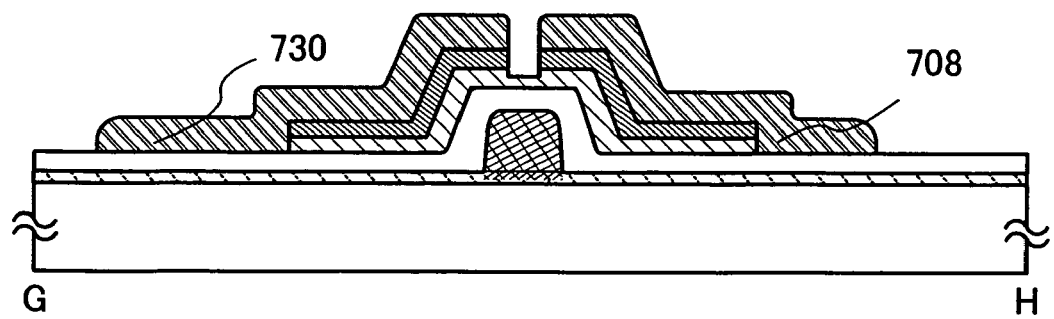

Source/drain electrode layers 730 and 708 are formed by discharging a composition including a conductive material, and the semiconductor layer 706 and the N-type semiconductor layer 707 are patterned using the source/drain electrode layers 730 and 708 as masks, so that the semiconductor layer 706 is exposed (see FIGS. 12A and 12B). The source/drain electrode layers 730 and 708 can be formed in a similar manner to how the aforementioned gate electrode layer 703 is formed. The source/drain electrode layer 730 also functions as a wiring layer.

As a conductive material forming the source/drain electrode layers 730 and 708, a composition mainly containing particles of a metal such as Ag (silver), Au (gold), Cu (copper), W (tungsten), or Al (aluminum). Also, indium tin oxide (ITO) having a light transmitting property, indium tin oxide including silicon oxide (ITSO), organic indium, organic tin, zinc oxide, titanium nitride, and the like may be combined.

Also, as a base pretreatment for a conductive layer formed using a droplet discharging method, the aforementioned process for forming a base film is carried out; furthermore, this treatment process may be carried out after the conductive layer is formed. By this process, adhesiveness between layers improves; therefore, reliability of a display device can also be improved.

Figure 13A:
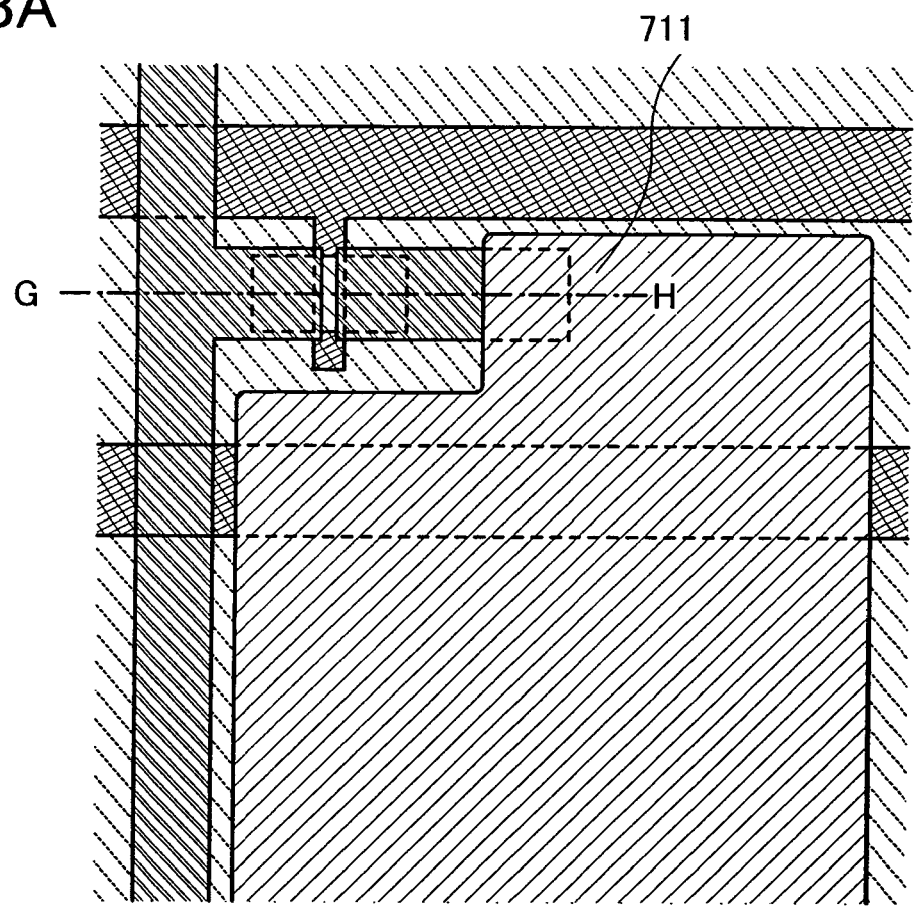
FIGS. 13A and 13B show a top view and a cross-sectional view, respectively, of a manufacturing process of a pixel portion in a display device to which the present invention is applied.
Figure 13B:
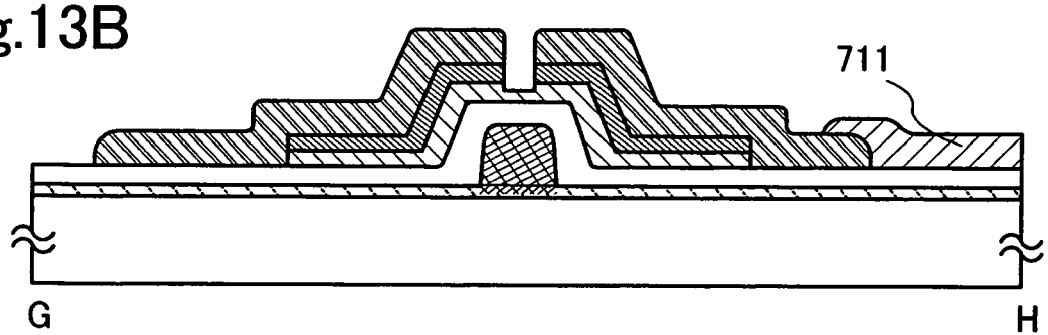

Subsequently, a pixel electrode layer 711 is selectively formed over the gate insulating layer 705 so as to be in contact with the source/drain electrode layer 708, by discharging a composition including a conductive material (see FIGS. 13A and 13B). In a case of manufacturing a transmissive type liquid crystal display panel, the pixel electrode layer 711 may be formed by forming a prescribed pattern with a composition including at least one of indium tin oxide (ITO), indium tin oxide including silicon oxide (ITSO), zinc oxide (ZnO), tin oxide ($SnO_2$) and the like, and then by baking.

The pixel electrode layer 711 can also be selectively formed over the gate insulating layer 705 before forming the source/drain electrode layer 708. In this case, in this embodiment mode, a connection structure of the source/drain electrode layer 708 and the pixel electrode layer 711 is a structure of laminating the source/drain electrode layer 708 over the pixel electrode layer. By forming the pixel electrode layer 711 before forming the source/drain electrode layer 708, a flat formation region can be formed; therefore, coatability is good, and the pixel electrode layer 711 can be formed with good flatness since a polishing treatment such as CMP can be carried out sufficiently.

Figure 14A:
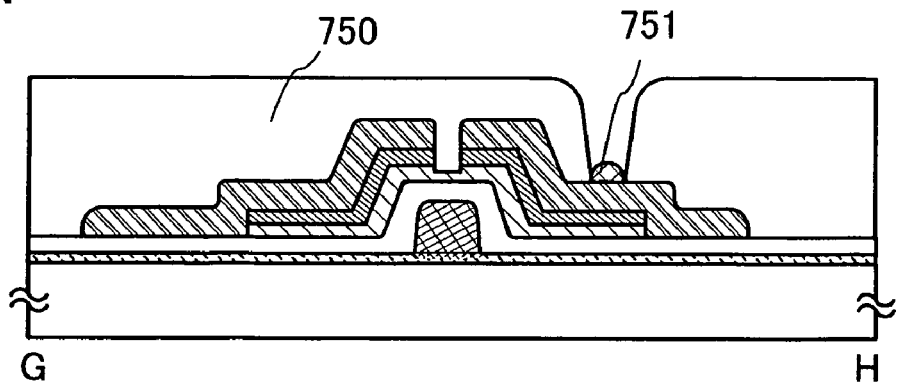
FIGS. 14A to 14C each show a cross-sectional view of a manufacturing process of a pixel portion in a display device to which the present invention is applied.
Figure 14B:
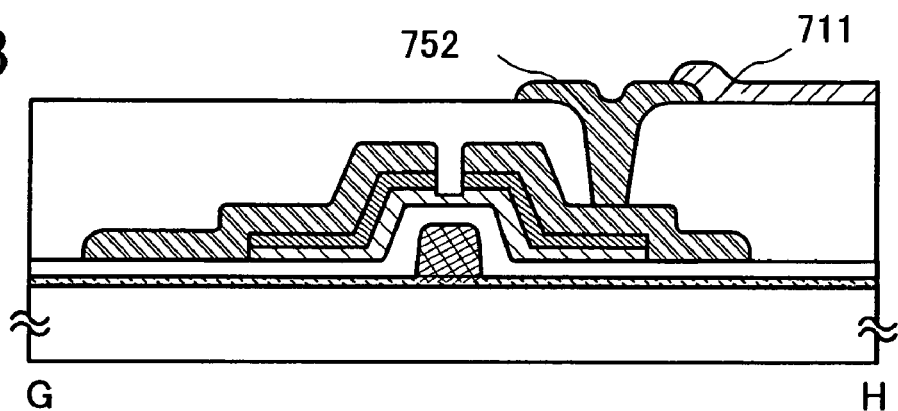
Figure 14C:
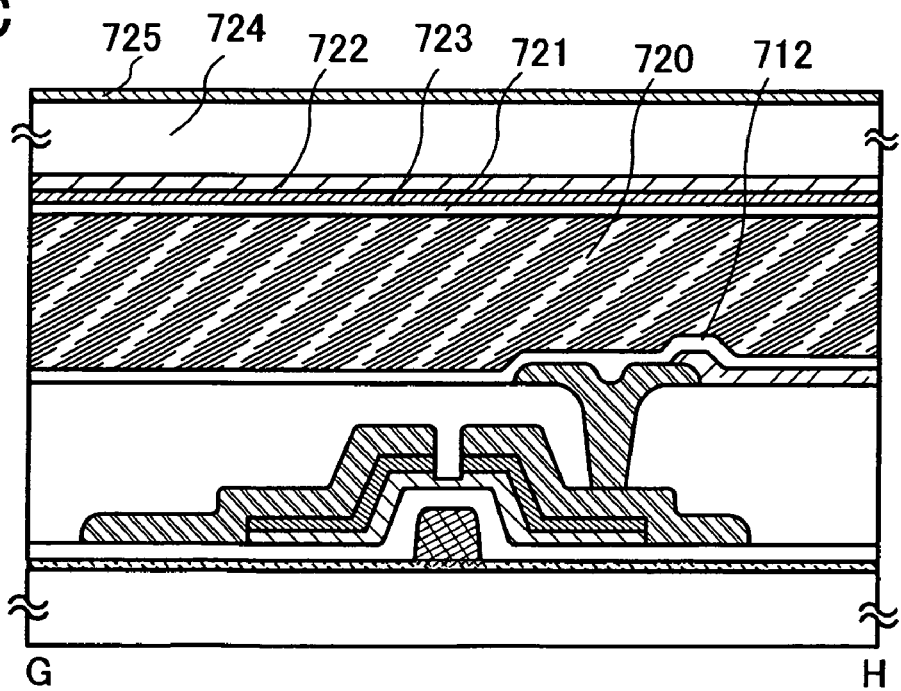

Also, as shown in FIGS. 14A to 14C, an insulator 750 that is to be an interlayer insulating layer may be formed over the source/drain electrode layer 708 so as that the source/drain electrode layer 708 is electrically connected to the pixel electrode layer 711 via a wiring layer 752. In this case, an opening portion (contact hole) is not formed by removing the insulator 750, but a substance 751 having low wettability with respect to the insulator 750 is formed over the source/drain electrode layer 708. Subsequently, when a composition including the insulator 750 is applied by an application method or the like, the insulator 750 is formed in a region excluding a region where the low wettability substance 751 is formed (see FIG. 14A).

After the insulator 750 is solidified by heating, drying or the like, the low wettability substance 751 is removed, and the opening portion is formed. The wiring layer 752 is formed so as to fill in this opening portion, and the pixel electrode layer 711 is formed so as to be in contact with this wiring layer 752 (see FIG. 14B). By using this method, it is not necessary to form the opening portion by etching; therefore, there is an effect that a process is simplified.

Also, in a case of forming the insulator 750 that is to be an interlayer insulating layer over the source/drain electrode layer 708 as in FIGS. 14A and 14B, another formation method of the opening portion can be used. In this case, a photosensitive insulator is used for the insulator 750. After the photosensitive insulator is formed as the interlayer insulating layer, a region thereof in which the opening potion is to be provided is irradiated with laser light, so that the insulator in that region is exposed to light. The insulator exposed to light is removed by etching or the like, and the opening portion (contact hole) reaching the source/drain electrode layer 708 is formed. A conductive layer is formed in this opening portion so as to be connected to the source/drain electrode layer 708, and a first electrode layer is formed so as to be connected to this conductive layer. In this embodiment mode, since modification and treatment processes by laser light irradiation are carried out, fine processing can be realized.

Further, the pixel electrode layer 711 is preferably formed of indium tin oxide (ITO), indium tin oxide including silicon oxide (ITSO), zinc oxide (ZnO), or the like by a sputtering method. More preferably, the pixel electrode layer 711 is formed using indium tin oxide including silicon oxide, by a sputtering method using a target of ITO including 2 to 10 wt % silicon oxide. Other than this, an oxide conductive material including silicon oxide, and in which 2 to 20 wt % zinc oxide (ZnO) is mixed in indium oxide, may be used. After forming the pixel electrode layer 711 by a sputtering method, a mask layer may be formed by a droplet discharging method and then etching the pixel electrode layer 711 into a desired pattern. In this embodiment mode, the pixel electrode layer 711 is formed of a conductive material having a light transmitting property using a droplet discharging method. Specifically, the pixel electrode layer 711 is formed using indium tin oxide, or ITSO constituted by ITO and silicon oxide.

Also, in a case of manufacturing a reflective type liquid crystal display panel, a composition mainly including particles of a metal such as Ag (silver), Au (gold), Cu (copper), W (tungsten), or Al (aluminum) can be used. As another method, the pixel electrode layer 711 may be formed by forming a transparent conductive film or a light reflecting conductive film by a sputtering method, forming a mask pattern by a droplet discharging method, and then combining an etching process.

The pixel electrode layer 711 may be swabbed and polished by a CMP method and by using a polyvinyl alcohol based porous body so that the surface is planarized. Also, after polishing using a CMP method, ultraviolet light irradiation, oxygen plasma treatment and the like may be carried out on a surface of the pixel electrode layer 711.

By the above process, a substrate 700 having a TFT for a display panel (liquid crystal display panel), in which a bottom gate type (also called "reverse stagger type") TFT is connected to a pixel electrode over the substrate 700 is completed. Further, a TFT of this embodiment mode is a channel-etch type.

Subsequently, as shown in FIG. 14C, an insulating layer 712 functioning as an orientation film is formed so as to cover the pixel electrode layer 711, by a chemical solution application method of the present invention. FIG. 14C is a cross-sectional view of the top view figures A shown in FIGS. 7 to 9 and 11 to 13 along lines G to H, as well as a completion drawing of a display panel. Note that the insulating layer 712 can be selectively formed by using a screen printing method or an offset printing method. Rubbing is carried out thereafter. Subsequently, a sealant is formed by a droplet discharging method in a peripheral region of where a pixel is formed (not shown in the figure).

Subsequently, a display panel (liquid crystal display panel) can be manufactured by sticking together an opposing substrate 724, for which the insulating layer 712 functioning as an orientation film, a coloring layer 722 functioning as a color filter, a conductive layer 723 functioning as an opposing electrode, and a polarizing plate 725 are provided, and the substrate 700 having a TFT via a spacer, and by providing a liquid crystal layer 720 in an air gap thereof (see FIG. 14C). A filler may be mixed in the sealant, and further, a shielding film (black matrix) or the like may be formed for the opposing substrate 724. Note that as a method of forming a liquid crystal layer, a dispenser method (dripping method) or a dip method (pumping method) in which a liquid crystal is injected using the capillary phenomenon, after sticking together the opposing substrate 724 with the substrate 700, can be used.

Figure 15:
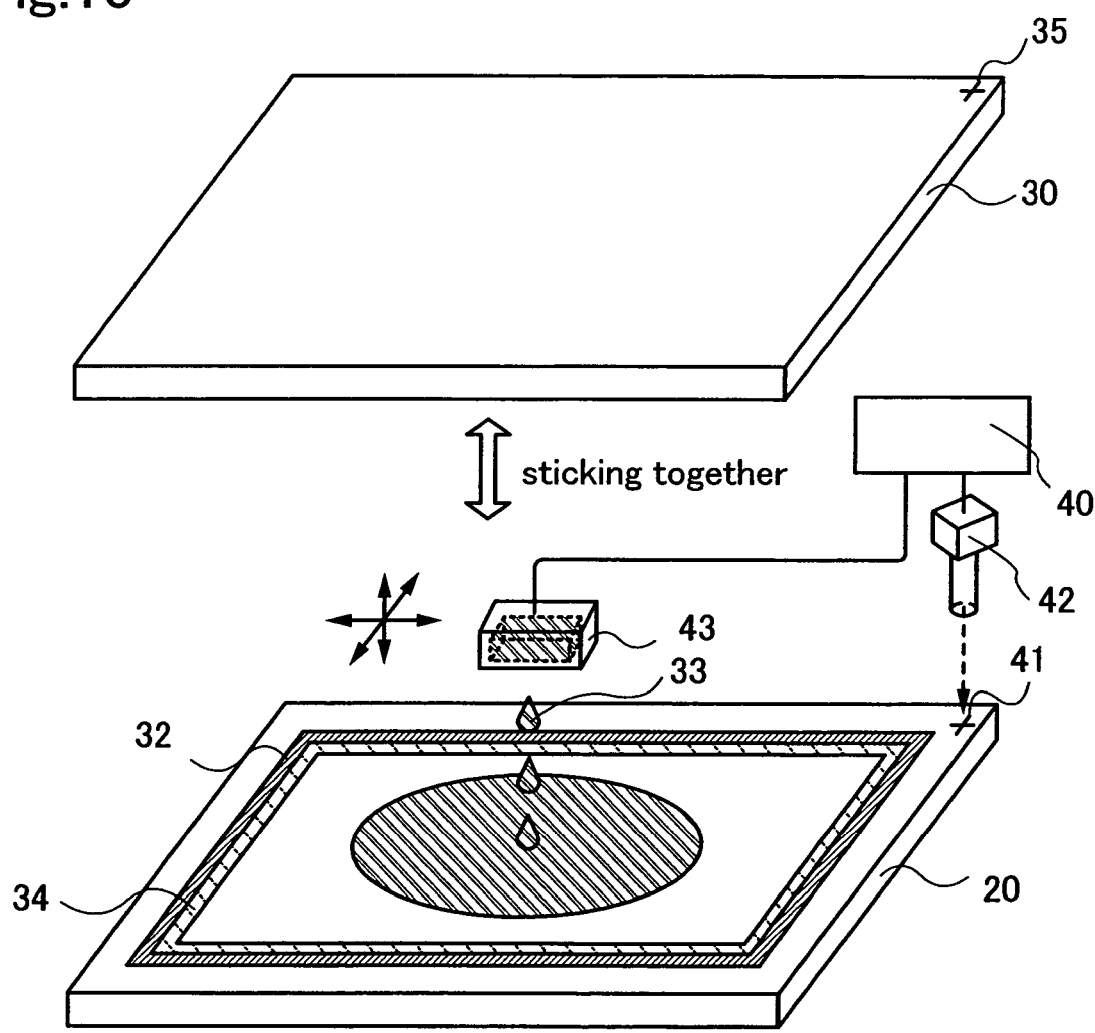
FIG. 15 shows a perspective view describing a liquid crystal drip injection method employing a dispenser method.

A liquid crystal drip injection method employing a dispenser method is described using FIG. 15. In FIG. 15, reference numerals 40, 42, 43, 33, 34, 32, 30, and 20 represent a control device, an imaging means, a head, a liquid crystal, a barrier layer, a sealant, a TFT substrate, and an opposing substrate, respectively, and reference numerals 35 and 41 each represent a marker. A closed loop is formed with the sealant 32, and the liquid crystal 33 is dripped once or multiple times therein by the head 43. The barrier layer 34 is provided so that a reaction of the sealant 32 and the liquid crystal 33 at that time is prevented. Subsequently, the TFT substrate 30 and the opposing substrate 20 are sealed together in a vacuum, and ultraviolet curing is carried out so as to be in a state of being filled with the liquid crystal. Needless to say, a chemical solution application apparatus of the present invention may be used to drip-inject the liquid crystal instead of a dispenser method.

A connecting portion is formed for connecting a pixel portion formed by the above process and an external wiring substrate. Under atmospheric pressure or around atmospheric pressure, an insulating layer of the connecting portion is removed by an ashing treatment using oxygen gas. This treatment is carried out by using oxygen gas and one or a plurality of hydrogen, $CF_4$, $NF_3$, $H_2O$, and $CHF_3$. In this process, an ashing treatment is carried out after sealing using the opposing substrate, in order to prevent damage and destruction by static electricity; however, when an influence of static electricity is small, the ashing treatment may be carried out at any time.

Subsequently, a wiring substrate for connection is provided so that the gate electrode layer 703 is electrically connected via an anisotropic conductive layer. The wiring substrate takes on a role of transmitting signals and electrical potentials from the exterior. Through the above process, a display panel (liquid crystal display panel) including a channel-etch type switching TFT and a capacitor element is completed. The capacitor element is formed with the capacitor wiring layer 704, the gate insulating layer 705, and the pixel electrode layer 711.

In the present embodiment mode, a single gate structure is described for the switching TFT; however, a structure may be a multigate structure such as a double gate structure.

As shown above, in this embodiment mode, by using a chemical solution application apparatus capable of moving a plurality of nozzles individually in applying a base film, a base film with even film thickness can be formed. As a result, an effect of shutting off a contaminant or the like from a glass substrate can be obtained. Also, when an insulating layer is formed between the substrate and the base film, by using the chemical solution application apparatus of the present invention, an insulating layer with even film thickness can be formed. As a result, contamination from the glass substrate to a semiconductor film can be prevented even further.

Embodiment Mode 3

By an application of the present invention, a variety of display devices can be manufactured. In other words, the present invention can be applied to a variety of electronic appliances in which these display devices are incorporated into displaying portions thereof.

As examples of such electronic appliances, video cameras; digital cameras; projectors; head-mounted displays (goggle type displays); car navigation systems; car stereos; personal computers; game machines; portable information terminals (such as a mobile computer, a cellular phone and an electronic book); image reproduction devices equipped with a recording medium (specifically, a device which can replay the recording medium such as a digital versatile disc (DVD) and display images thereof); and the like can be given. Examples thereof are shown in FIGS. 16A to 16D.

Figure 16A:
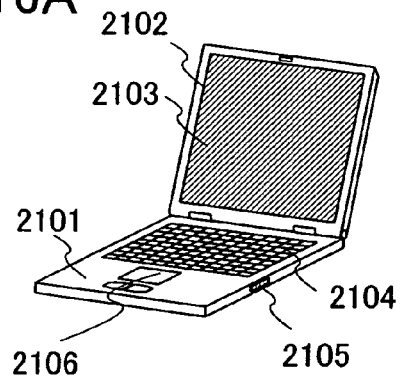
FIGS. 16A to 16D each show an electrical appliance to which the present invention is applied.

FIG. 16A shows a personal computer, which includes a main body 2101, a housing 2102, a display portion 2103, a keyboard 2104, an external connection port 2105, a pointing mouse 2106, and the like. The display portion 2103 can be manufactured according to the present invention. By using the present invention, film thickness can be made to be even entirely over each layer; therefore, a highly reliable image can be displayed.

Figure 16B:
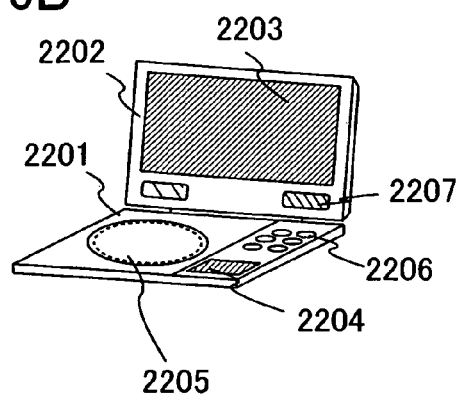

FIG. 16B shows an image reproduction device equipped with a recording medium (specifically, a DVD player), and includes a main body 2201, a housing 2202, a display portion A 2203, a display portion B 2204, a recording medium (a DVD and the like) reading portion 2205, operation keys 2206, speaker portions 2207, and the like. The display portion A 2203 mainly displays image information, while the display portion B 2204 mainly displays character information. These display portion A 2203 and display portion B 2204 can be manufactured according to the present invention. By using the present invention, film thickness can be made to be even entirely over each layer; therefore, a highly reliable image can be displayed.

Figure 16C:
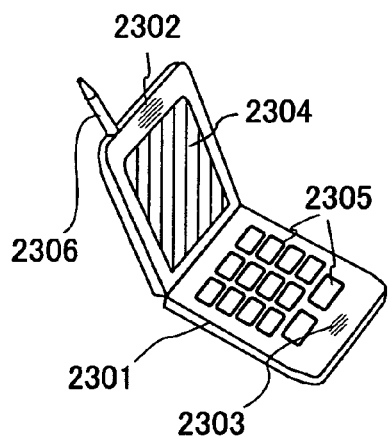

FIG. 16C shows a cellular phone, which includes a main body 2301, an audio output portion 2302, an audio input portion 2303, a display portion 2304, operation switches 2305, an antenna 2306, and the like. By applying a display device formed according to the present invention to the display portion 2304, film thickness can be made to be even entirely over each layer; therefore, a high reliability image can be displayed.

Figure 16D:
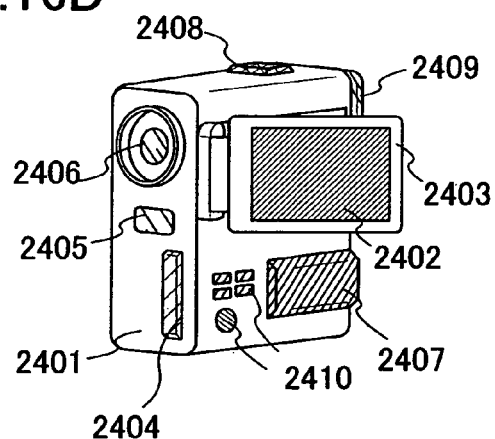

FIG. 16D shows a video camera, which includes a main body 2401, a display portion 2402, a housing 2403, an external connection port 2404, a remote control receiver 2405, an image receiving portion 2406, a battery 2407, an audio input portion 2408, an eyepiece 2409, operation keys 2410, and the like. The display portion 2402 can be formed according to the present invention. By applying a display device formed according to the present invention to the display portion 2402, film thickness can be made to be even entirely over each layer; therefore, a high reliability image can be displayed.

Embodiment 1

In this embodiment, a manufacturing method of a semiconductor device is described, in which a solution of an aqueous solution including a catalyst element that promotes crystallization is applied evenly and thinly over an amorphous silicon film using a chemical solution application apparatus of the present invention, and then the amorphous silicon film is crystallized by heating.

Figure 4A:
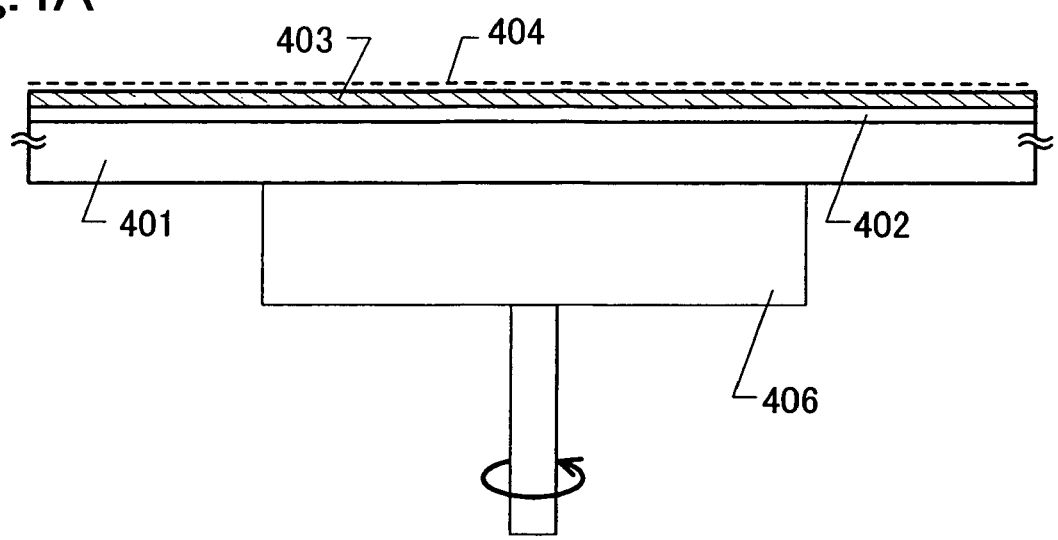
FIGS. 4A and 4B show a case of using a chemical solution application method of the present invention for a crystallization technique.
Figure 4B:
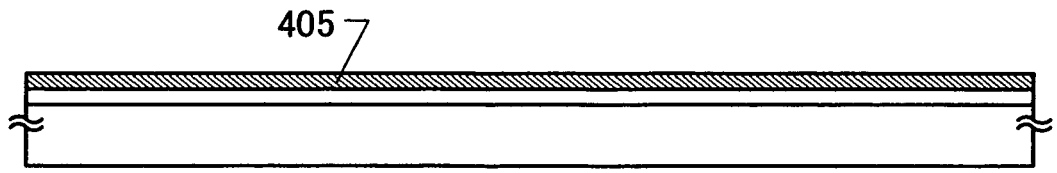

FIGS. 4A and 4B show examples of applying the present invention to crystallization techniques disclosed in Japanese Patent Application Laid-Open No. H7-130652 and Japanese Patent Application Laid-Open No. H8-78329. First, a base film 402 is provided over a substrate 401 that is fixed to a suction stage 406, and then an amorphous silicon film 403 is formed thereover. As the base film 402, a silicon oxide film, a silicon nitride film, or a silicon nitride oxide film that has a film thickness of 100 to 300 nm can be used. In this embodiment, TEOS (Tetraethyl Orthosilicate) is used as a raw material, and a silicon oxide film is formed to have a film thickness of 200 nm. Note that if the substrate 401 has enough flatness like a quartz substrate, the base film 402 is not particularly necessary to be provided.

Here, a nickel-containing layer 404 is formed by applying a nickel acetate solution containing nickel of 10 ppm in weight over the amorphous silicon film 403, using a chemical solution application apparatus of the present invention (see FIG. 4A). By using the present invention, the nickel acetate solution containing nickel can be evenly applied over the amorphous silicon film.

Subsequently, a crystalline silicon film 405 is formed by a one hour dehydrogenation process at 500° C. and then carrying out a heat treatment for 4 to 12 hours at 500 to 650° C. (in this embodiment, for 4 hours at 550° C.). The crystalline silicon film (also called "polysilicon") 405 obtained in this manner is formed by an assembly of stick-like or needle-like crystals, and from a macroscopic perspective, each of the crystals grows with a certain orientation; therefore, an advantage is that crystal property is uniform.

For the solution used for the application, a solution including an element such as germanium (Ge), iron (Fe), palladium (Pd), tin (Sn), lead (Pb), cobalt (co), platinum (Pt), copper (Cu), or gold (Au), besides nickel (Ni), may be used.

Further, in this embodiment, a method of introducing a catalyst element over an amorphous silicon film is described; however, a method of introducing the catalyst element under the amorphous silicon film may be employed. In this case, a solution including the catalyst element may be applied over a base film using a chemical solution application apparatus of the present invention prior to forming the amorphous silicon film.

In this manner, by using the chemical solution application apparatus of the present invention in applying a catalyst element promoting crystallization, a coating film with even film thickness can be provided at the same time as controlling a usage amount of the catalyst element. As a result, uniform crystallization can be carried out.

Embodiment 2

Figure 5A:
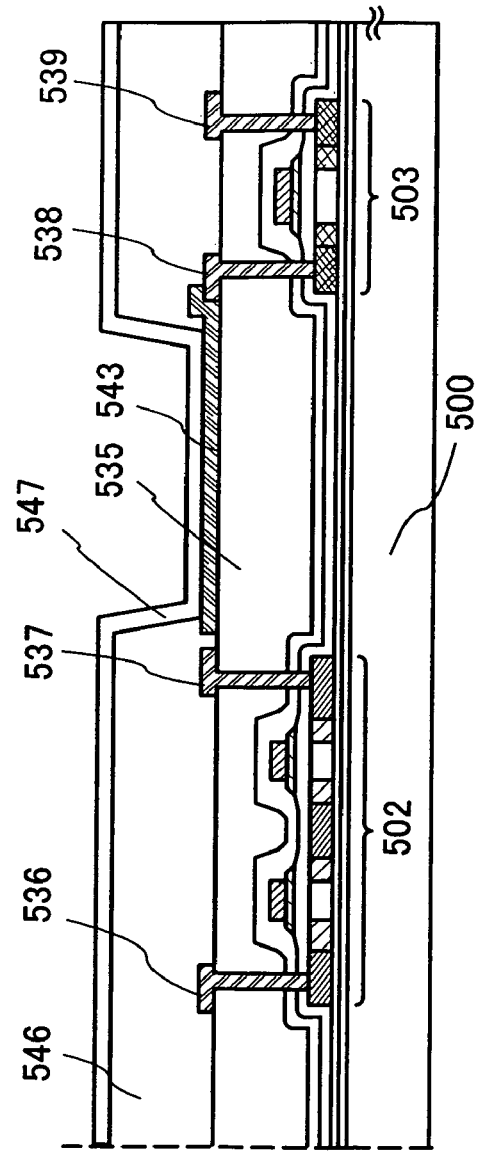
FIGS. 5A and 5B show manufacturing an EL light emitting element using the present invention.

In this embodiment, an example of forming an insulating film over a surface of an anode of an EL light emitting element, using a chemical solution application apparatus of the present invention is described with reference to FIGS. 5A and 5B.

First, over a substrate 500, a switching TFT (a thin film transistor functioning as a switching element) 502 and a current control TFT (a TFT functioning as an element for controlling a current that is supplied to an EL element. Also referred to as a driving TFT) 503 are formed. Detailed manufacturing methods of the TFTs are omitted herein. Note that as the substrate 500, a substrate having a light transmitting property such as a quartz substrate may be used. Also, a plastic substrate having a heat resistant property that can resist a treatment temperature of this embodiment may be used.

An interlayer insulating film 535 made from an inorganic insulating material is formed covering the switching TFT 502 and the current control TFT 503, so as to have an average film thickness of 1.0 to 2.0 μm. As the inorganic insulating material, a silicon oxide film or a silicon oxynitride film may be formed using a known sputtering method or plasma CVD method. Further, in a case of using a silicon nitride oxide film, it may be formed by a plasma CVD device using $SiH_4$ and $N_2O$ as material gases under the following film forming conditions: pressure of 40 Pa, substrate temperature of 400° C., an RF output of 100W, and flow rates of the material gases are to be 4 sccm for $SiH_4$ and 400 sccm for $N_2O$.

Subsequently, the interlayer insulating film is polished and planarized by a technique called a CMP (chemical mechanical polish) method. A CMP method is a method of chemically or mechanically planarizing a surface of a processing object. The CMP method is a method in which in general, an abrasive cloth or a polishing pad (in this specification, hereinafter called a "pad" as a collective term) is attached to a platen (polishing plate), and then rotating or rocking each of the platen and the processing object while supplying a slurry between the processing object and the pad, so that a surface of the processing object is polished by a compound effect of a chemical effect and mechanical polishing. In this embodiment, after forming the interlayer insulating film 535, the interlayer insulating film 535 is polished by the CMP method. The slurry, the pad, and a CMP apparatus used in the CMP method can be those that are known, and a polishing method can also be a known method. Note that after a planarization treatment process by the CMP method is completed, an average film thickness of the interlayer insulating film 535 is made to be about 1.0 to 2.0 μm. Further, an insulating film made of a silicon nitride film or a DLC (Diamond Like Carbon) film may be provided over the interlayer insulating film 535 for which the planarization treatment is carried out. In this manner, by forming an insulating film made of a silicon nitride film or a DLC film, it can be considered that an alkali metal used when forming a light emitting element can be prevented from penetrating to a TFT side through the interlayer insulating film.

Subsequently, a resist mask in a prescribed pattern is formed, and a contact hole is formed so as to reach an impurity region that is a source region or a drain region, formed in a semiconductor layer of each TFT. The contact hole is formed by a dry etching method.

Then, wirings 536 to 539 are formed by forming a conductive metal film by a sputtering method or a vacuum evaporation method, and then etching the metal film using a mask. Although not shown in a figure, in this embodiment, these wiring are formed with a laminated film of a Ti film having a film thickness of 50 nm and an alloy film (an alloy film of Al and Ti) having a film thickness of 500 nm.

Subsequently, a transparent conductive film is formed thereover with a thickness of 80 to 120 nm and then etched to form an anode 543 (pixel electrode) (see FIG. 5A). Note that in this embodiment, as a transparent electrode, a transparent conductive film in which zinc oxide (ZnO) of 2 to 20 wt % composition is mixed in an indium tin oxide (ITO) film or indium oxide is used.

Also, by forming the anode 543 so as to be in contact and to be overlapped with the drain wiring 538, an electrical connection between the anode 543 and a drain region of the current control TFT. Here, a heating treatment at 180 to 350° C. may be carried out for the anode 543.

Subsequently, a second interlayer insulating film is formed over the anode 543, and by etching the second interlayer insulating film, a partition (bank) 546 having an opening portion in a position that corresponds to a pixel (light emitting element) is formed. In this embodiment, the bank 546 is formed using a resist. A thickness of the bank 546 is to be about 1 μm, and a region covering a potion where the wiring and the anode is in contact is formed to be slanted.

Note that in this embodiment, a film made from a resist is used as the bank 546; however, depending on the circumstance, polyimide, polyamide, acrylic, BCB (benzocyclobutene), a silicon oxide film, or the like can also be used. For the bank 546, either an organic substance or an inorganic substance may be used as long as it is a substance having an insulating property. Note that when the bank 546 is formed using a photosensitive acrylic film, it is preferable to carry out a heating treatment at 180 to 350° C. after etching a photosensitive acrylic film. Further, when the bank 546 is formed using a non-photosensitive acrylic, it is preferable to etch after carrying out a heating treatment at 180 to 350° C. to form the bank.

Subsequently, a swabbing treatment is carried out on a surface of the anode (electrode) 543. Note that in this embodiment, by swabbing the surface of the anode 543 using a porous sponge (typically made of PVA (polyvinyl alcohol), nylon, or the like) in which a surfactant (weakly alkaline) is included, planarization of the anode 543 surface and removal of particles stuck to the surface is carried out. As a cleaning liquid for when the particles are removed, purified water is used, and a rotation speed of an axis to which the porous sponge is wrapped around is to be 100 to 300 rpm, and push-in value is to be 0.1 to 1.0 mm. Note that as a cleaning mechanism, a cleaning apparatus having a roll brush (made of PVA) that rotates around an axis line parallel to a substrate surface and touches the substrate surface may be used, as well as a cleaning apparatus having a disk brush (made of PVA) that rotates around an axis line perpendicular to a substrate surface and touches the substrate surface.

Subsequently, a third insulating film 547 is formed covering the bank 546 and the anode 543. The third insulating film 547 is formed with an organic resin film of polyimide, polyamide, polyimide amide, or the like by a chemical solution application apparatus of the present invention, so as to have a film thickness of 1 to 5 nm. By using the chemical solution application apparatus of the present invention in applying the organic resin film, a coating film having an even film thickness can be provided while suppressing a usage amount of the resin film. By forming the third insulating film 547 to have an even film thickness, cracks and the like on a surface of the anode 543 can be covered up, and deterioration of a light emitting element can be prevented.

Figure 5B:
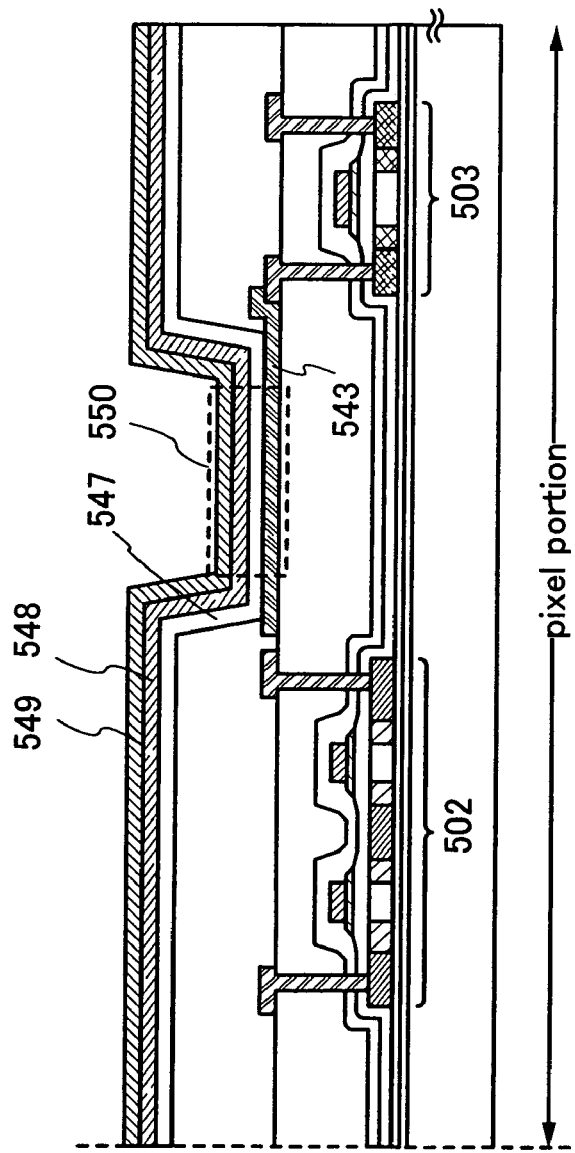

Next, a light emitting element 550 is formed by forming an organic compound layer 548 and a cathode 549 over the third insulating film 547 by an evaporation method (FIG. 5B). Note that although an MgAg electrode is used as the cathode 549 of the light emitting element 550 in this embodiment, another known material may be used. Note that the organic compound layer 548 is formed by combining and laminating a plurality of layers such as a hole injecting layer, a hole transporting layer, an electron transporting layer, an electron injecting layer, and a buffer layer in addition to a light emitting layer. Note that in this embodiment, the organic compound layer 548 and the cathode 549 are formed over the anode 543; however, the organic compound layer 548 and the anode 543 may be provided over the cathode 549. The same applies to another embodiment.

Embodiment 3

In this embodiment, an example of using a chemical solution application apparatus of the present invention to form a light emitting layer used in a light emitting element is described.

First, a typical structure of a light emitting element is shown in FIG. 6. An anode 601, a light emitting layer 602, and a cathode 603 are laminated over a substrate 600. It is acceptable as long as the light emitting layer 602 includes at least a light emitting organic compound, and can be formed using a low molecular compound, a high molecular compound (polymer), as well as a medium molecular compound such as an olygomer or a dendrimer, or an inorganic compound. For the light emitting organic compound also, a low molecular compound, a high molecular compound (polymer), as well as a medium molecular compound such as an olygomer or a dendrimer can be used.

In FIG. 6 of this embodiment, the light emitting layer is constituted by a hole injecting layer 611, a hole transporting layer 612, a layer 613 including a light emitting organic compound, an electron transporting layer 614, and an electron injecting layer 615; however, it is not necessarily limited to this structure. Note that the hole injecting layer is a layer showing a function of receiving holes from the anode, and the hole transporting layer is a layer showing a function of transferring holes to the layer including a light emitting organic compound. Further, the electron injecting layer is a layer showing a function of receiving electrons from the cathode, and the electron transporting layer is a layer showing a function of transferring electrons to the layer including a light emitting organic compound.

First, materials that can be used for each layer is specifically shown as examples. However, materials that can be applied to the present invention are not limited to these.

As a hole injecting material that can be used for the hole injecting layer, a phthalocyanine based compound is effective, such as phthalocyanine (abbreviation: $H_2$—Pc), copper phthalocyanine (abbreviation: Cu—Pc), or vanadyl phthalocyanine (abbreviation: VOPc). Also, a material to which chemical doping is done on a conductive high molecular compound is also available, and polyethylenedioxythiophene (abbreviation: PEDOT) doped with polystyrene sulfonate (abbreviation: PSS), polyaniline (abbreviation: Pani) or the like can also be used. Further, a thin film of an inorganic semiconductor such as molybdenum oxide ($MoO_x$), vanadium oxide ($VO_x$), or nickel oxide ($NiO_x$); or an ultra thin film of an inorganic insulator such as aluminum oxide ($Al_2O_3$) is also effective. Furthermore, an aromatic amine compound such as 4,4',4"-tris(N,N-diphenyl-amino)-triphenylamine (abbreviation: TDATA), 4,4',4"-tris[N-(3-methylphenyl)-N-phenyl-amino]-triphenylamine (abbreviation: MTDATA), N,N'-bis(3-methylphenyl)-N,N'-diphenyl-1,1'-biphenyl-4,4'-diamine (abbreviation: TPD), 4,4'-bis[N-(1-naphthyl)-N-phenyl-amino]-biphenyl (abbreviation: α-NPD), or 4,4'-bis[N-(4-(N,N-di-m-tolylamino)phenyl)-N-phenylamino] biphenyl (abbreviation: DNTPD) can also be used. Also, a substance showing an acceptor property with respect to the aromatic amine compounds may be added; specifically, a material in which 2,3,5,6-tetrafluoro-7,7,8,8-tetracyanoquinodimethane (abbreviation: $F_4$-TCNQ) which is an acceptor is added to VOPc, or a material in which $MoO_x$ which is an acceptor is added to α-NPD, may be used.

By using a chemical solution application apparatus of the present invention for applying the hole injecting material, a coating film of the hole injecting material with an even thickness can be obtained, which has a small film thickness distribution over the entire anode. Also, since a chemical solution can be discharged into an optimal pattern by a plurality of nozzles, use efficiency can be improved by cutting down on waste of a chemical solution.

As a hole transporting material that can be used for the hole transporting layer, an aromatic amine compound is optimal, and the aforementioned TDATA, MTDATA, TPD, α-NPD, DNTPD and the like can be used.

By using a chemical solution application apparatus of the present invention for applying the hole transporting material, a coating film of the hole transporting material with an even thickness can be obtained, which has a small film thickness distribution over the entire hole injecting layer. Also, since a chemical solution can be discharged into an appropriate pattern by a plurality of nozzles, use efficiency can be improved by cutting down on waste of a chemical solution.

Subsequently, materials that can be used as the light emitting organic compound are listed; however, a material is not limited thereto in this present invention, and any light emitting organic compound may be used.

For example, blue to blue-green light emission is obtained by dispersing a guest material such as perylene, 2,5,8,11-tetra-t-butylperylene (abbreviation: TBP) or 9,10-diphenylanthracene in an appropriate host material. In addition, blue to blue-green light emission can be obtained by a styrylarylene derivative such as 4,4'-bis(2,2-diphenylvinyl)biphenyl (abbreviation: DPVBi), or an anthracene derivative such as 9,10-di-2-naphthylanthracene (abbreviation: DNA) or 9,10-bis(2-naphthyl)-2-t-butylanthracene (abbreviation: t-BuDNA). Further, a polymer such as poly(9,9-dioctylfluolene) may be used.

For example, blue-green to green light emission is obtained by dispersing a guest material such as a coumarin dye such as coumarin 30 or coumarin 6; bis[2-(4,6-difluorophenyl)pyridinato-N,C2'](picolinato) iridium (abbreviation: FIrpic); bis(2-phenylpyridinato-N,C2') (acetylacetonato) iridium (abbreviation: Ir(ppy)$_2$(acac)) or the like in an appropriate host material. In addition, blue-green to green light emission can be obtained by dispersing a high concentration of perylene or TBP mentioned above, 5 wt % or more, in an appropriate host material. Also, it can be obtained from a metal complex such as BAlq, Zn(BTZ)$_2$, or bis(2-methyl-8-quinolinolato)chlorogallium (Ga(mq)$_2$Cl). In addition, a polymer such as poly (p-phenylenevinylene) may be used.

For example, yellow to orange light emission is obtained by dispersing a guest material such as rubrene, 4-(dicyanomethylene)-2-[p-(dimethylamino)styryl]-6-methyl-4H-pyran (abbreviation: DCM1), 4-(dicyanomethylene)-2-methyl-6-(9-julolidyl) ethynyl-4H-pyran (abbreviation: DCM2), bis[2-(2-thienyl)pyridinato]acetylacetonato iridium (Ir(thp)$_2$(acac)), bis-(2-phenylquinolinato)acetylacetonato iridium (Ir(pq)$_2$(acac)), or the like in an appropriate host material. In addition, yellow to orange light emission can be obtained from a metal complex such as bis(8-quinolinolato)zinc (abbreviation: Znq$_2$) or bis[2-cinnamoyl-8-quinolinolato) zinc (abbreviation: Znsq$_2$). In addition, a polymer such as poly(2,5-dialkoxy-1,4-phenylenevinylene) may be used.

For example, orange to red light emission can be obtained by dispersing a guest material such as 4-(dicyanomethylene)-2,6-bis[p-(dimethylamino)styryl]-4H-pyran (abbreviation: BisDCM), 4-(dicyanomethylene)-2,6-bis[2-(julolidin-9-yl)ethynyl]-4H-pyran (abbreviation: BisDCJ), 4-(dicyanomethylene)-2-methyl-6-(9-julolidyl)ethynyl-4H-pyran (abbreviation: DCM2), bis[2-(2-thienyl)pyridinato]acetylacetonato iridium ($Ir(thp)_2(acac)$), bis-(2-phenylquinolinato)acetylacetonato iridium ($Ir(pq)_2(acac)$), bis[2-(2'-benzothienyl)pyridinato-N,C3'](acetylacetonato) iridium (abbreviation: $Ir(btp)_2(acac)$), or the like in an appropriate host material. In addition, orange to red light emission can be obtained from a metal complex such as bis(8-quinolinolato)zinc (abbreviation: $Znq_2$) or bis(2-cinnamoyl-8-quinolinolato)zinc (abbreviation: $Znsq_2$). Further, a polymer such as poly(3-alkylthiophene) may be used.

In addition, among the light emitting organic compounds mentioned above, it is particularly preferable to use a phosphorescent material such as FIrpic, $Ir(ppy)_2(acac)$, $Ir(thp)_2(acac)$, $Ir(pq)_2(acac)$, or $Ir(btp)_2(acac)$. Since a current amount is increased with time in a light emitting element to which the present invention is applied, increase in power consumption is large. However, when the phosphorescent material is used, power consumption can be reduced typically.

As the appropriate host material in the aforementioned structures, a host material which has a shorter wavelength than the light emitting organic compound or one which has a large energy gap is acceptable. Specifically, a hole transporting material or an electron transporting material typified by the foregoing examples can be appropriately selected. Also, 4,4'-bis(N-carbazolyl)-biphenyl (abbreviation: CBP), 4,4',4''-tris(N-carbazolyl)triphenylamine (abbreviation: TCTA), 1,3,5-tris[4-(N-carbazolyl)phenyl]benzene (abbreviation: TCPB), or the like may be used.

By using a chemical solution application apparatus of the present invention for applying the light emitting organic compound, a coating film of the material that can be used as the light emitting organic compound can be obtained with an even thickness, and also with a small film thickness distribution over an entire hole transporting layer. Also, since a chemical solution can be discharged into an appropriate pattern by a plurality of nozzles which are variable individually, use efficiency can be improved by cutting down on waste of a chemical solution.

As an electron transporting material that can be used for the electron transporting layer, a metal complex such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-(4-phenylphenolato)-aluminum (abbreviation: BAlq), bis[2-(2-hydroxyphenyl)benzoxazolato]zinc (abbreviation: $Zn(BOX)_2$), bis[2-(2-hydroxyphenyl)benzothiazolato]zinc (abbreviation: $Zn(BTZ)_2$), can be given. Further, other than a metal complex, an oxadiazole derivative such as 2-(4-biphenylyl)-5-(4-tert-butylphenyl)-1,3,4-oxadiazole (abbreviation: PBD), or 1,3-bis[5-p-tert-butylphenyl)-1,3,4-oxadiazole-2-yl]benzene (abbreviation: OXD-7); a triazole derivative such as 3-(4-tert-butylphenyl)-4-phenyl-5-(4-biphenylyl)-1,2,4-triazole (abbreviation: TAZ), 3-(-tert-butylphenyl)-4-(4-ethylphenyl)-5-(4-biphenylyl)-1,2,4-triazole (abbreviation: p-EtTAZ), or the like; an imidazole derivative such as 2,2',2''-(1,3,5-benzenetriyl)-tris[1-phenyl-1H-benzoimidazole] (abbreviation: TPBI); a phenanthroline derivative such as bathophenanthroline (abbreviation: BPhen), or bathocuproin (BCP); can be used.

By using a chemical solution application apparatus of the present invention for applying the electron transporting layer, a coating film of the electron transporting material with an even thickness can be obtained, that has a small film thickness distribution over the layer including a light emitting organic compound. Also, in the present invention, since a chemical solution can be discharged into an optimal pattern by a plurality of nozzles which are variable individually, use efficiency can be improved by cutting down on waste of a chemical solution.

As an electron injecting material that can be used for the electron injecting layer, the aforementioned electron transporting material of $Alq_3$, $Almq_3$, $BeBq_2$, BAlq, $Zn(BOX)_2$, $Zn(BTZ)_2$, PBD, OXD-7, TAZ, p-EtTAZ, TPBI, BPhen, BCP, or the like can be used. In addition, an ultra thin film of an insulator like an alkali metal halide such as LiF or CsF; an alkali earth halide such as $CaF_2$; or an alkali metal oxide such as $Li_2O$ is often used. Also, an alkali metal complex such as lithium acetylacetonate (abbreviation: Li(acac)) or 8-quinolinolato-lithium (abbreviation: Liq) is also effective. Further, a substance showing a donor property with respect to the electron injecting material may be added, and as a donor, an alkali metal, an alkali earth metal, a rare earth metal or the like can be used. Specifically, BCP to which lithium which is a donor is added, or $Alq_3$ to which lithium which is a donor is added, can be used.

By using a chemical solution application apparatus of the present invention for applying the electron injecting material, a coating film of the electron injecting material with an even thickness can be obtained, which has a small film thickness distribution over the entire electron transporting layer. Also, since a chemical solution can be discharged into an appropriate pattern by a plurality of nozzles which are variable individually, use efficiency can be improved by cutting down on waste of a chemical solution.

As a material constituting the anode 601 in a light emitting element, a conductive material with a large work function is preferably used. Also, in a case of extracting light from the anode 601, a transparent conductive material such as indium tin oxide (ITO), indium zinc oxide (IZO), zinc oxide (ZnO), or indium tin oxide to which silicon oxide is added, may be used. Further, if the anode 601 is to have a light shielding property, in addition to a single layer film of TiN, ZrN, Ti, W, Ni, Pt, Cr or the like; a lamination of a titanium nitride film and a film mainly containing aluminum; a three layer structure of a titanium nitride film, a film mainly containing aluminum, and a titanium nitride film; or the like can be used. Alternatively, a method may be that of laminating the foregoing transparent conductive material over a reflective electrode of Ti, Al or the like.

Also, as a material constituting the cathode 603, a conductive material with a small work function is preferably used. Specifically, in addition to an alkali metal such as Li or Cs, an alkali earth metal such as Mg, Ca, or Sr, or an alloy including thereof (such as Mg:Ag or Al:Li), a rare earth metal such as Yb or Er can also be used to form the cathode 603. Also, another conductive material (for example aluminum or the like) may be laminated over the conductive material. Further, in a case of using an electron injecting layer of LiF, CsF, $CaF_2$, $Li_2O$, or the like, an ordinary conductive thin film such as aluminum can be used. Furthermore, in a case of making an cathode 603 side as a light extraction direction, a lamination structure of an ultra thin film including an alkali metal such as Li or Cs and an alkali earth metal such as Mg, Ca, or Sr; and a transparent conductive film (such as ITO, IZO, or ZnO) may be used. Alternatively, a structure may be that of lamination of a layer to which the aforementioned substance (such as an alkali metal or an alkali earth metal) showing a donor property with respect to the electron transporting material is added, and a transparent conductive film (ITO, IZO, ZnO or the like). Specifically, ITO may be laminated over a layer in which lithium which is a donor is added to BCP, or a layer in which lithium which is a donor is added to Alq$_3$.

In manufacturing a light emitting element in the above manner, a chemical solution application apparatus of the present invention can be used to form each of the layers in the light emitting layer 602. As a result, since a chemical solution can be discharged into an appropriate pattern by a plurality of nozzles which are mobile individually and independently, use efficiency can be improved by cutting down on waste of a chemical solution.

This application is based on Japanese Patent Application serial no. 2005-170921 filed in Japan Patent Office on Jun. 10, 2005, the entire contents of which are incorporated by reference.

What is claimed is:

1. A chemical solution application apparatus comprising:
a stage for holding a substrate;
a guide rail provided facing the stage on which the substrate is configured to be held;
a plurality of nozzles for discharging a chemical solution provided facing the stage on which the substrate is configured to be held;
a driving mechanism for moving each of the plurality of nozzles; and
a control portion for controlling an amount of chemical solution that is discharged from the plurality of nozzles,
wherein the plurality of nozzles are each capable of moving along the guide rail, and
wherein the guide rail is arranged in a matrix form.

2. The chemical solution application apparatus according to claim 1, wherein the plurality of nozzles are capable of moving in a vertical direction with respect to a surface of the stage on which the substrate is held.

3. A chemical solution application apparatus comprising:
a stage for holding a substrate;
a guide rail provided facing the stage on which the substrate is configured to be held;
a plurality of nozzles for discharging a chemical solution provided facing the stage on which the substrate is configured to be held;
a first driving mechanism for moving each of the plurality of nozzles;
a second driving mechanism for moving the stage; and
a control portion for controlling an amount of chemical solution that is discharged from the plurality of nozzles,
wherein the plurality of nozzles are each capable of moving along the guide rail, and
wherein the guide rail is arranged in a matrix form.

4. The chemical solution application apparatus according to claim 3, wherein the plurality of nozzles are capable of moving in a vertical direction with respect to a surface of the stage on which the substrate is held.

5. A chemical solution application apparatus comprising:
a stage for holding a substrate;
a guide rail provided facing the stage on which the substrate is configured to be held;
a plurality of nozzles for discharging a chemical solution provided facing the stage on which the substrate is configured to be held;
a first driving mechanism for moving each of the plurality of nozzles;
a second driving mechanism for moving the stage;
a tank for storing the chemical solution; and
a control portion connected to the tank via a piping for controlling an amount of chemical solution that is discharged from the plurality of nozzles,
wherein the plurality of nozzles are each capable of moving along the guide rail, and
wherein the guide rail is arranged in a matrix form.

6. The chemical solution application apparatus according to claim 5, wherein the plurality of nozzles are capable of moving in a vertical direction with respect to a surface of the stage on which the substrate is held.

7. The chemical solution application apparatus according to claim 5, wherein the tank is operationally connected with one of the plurality of nozzles.

8. The chemical solution application apparatus according to claim 7, further comprising another tank which is operationally connected with another one of the plurality of nozzles.

9. A chemical solution application apparatus comprising:
a stage for holding a substrate;
a guide rail provided facing the stage on which the substrate is configured to be held;
a plurality of nozzles held by the guide rail for discharging a chemical solution;
a tank for storing the chemical solution; and
a control portion connected to the tank via a piping for controlling an amount of chemical solution that is discharged from the plurality of nozzles,
wherein the plurality of nozzles are each capable of moving along the guide rail, and
wherein the guide rail is arranged in a matrix form.

10. The chemical solution application apparatus according to claim 9, wherein the plurality of nozzles are capable of moving in a vertical direction with respect to a surface of the stage on which the substrate is held.

11. The chemical solution application apparatus according to claim 9, wherein the tank is operationally connected with one of the plurality of nozzles.

12. The chemical solution application apparatus according to claim 11, further comprising another tank which is operationally connected with another one of the plurality of nozzles.

* * * * *